US011705367B2

(12) United States Patent
Parekh

(10) Patent No.: US 11,705,367 B2
(45) Date of Patent: Jul. 18, 2023

(54) METHODS OF FORMING MICROELECTRONIC DEVICES, AND RELATED MICROELECTRONIC DEVICES, MEMORY DEVICES, ELECTRONIC SYSTEMS, AND ADDITIONAL METHODS

(71) Applicant: Micron Technology, Inc., Boise, ID (US)

(72) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/905,452

(22) Filed: Jun. 18, 2020

(65) Prior Publication Data

US 2021/0398847 A1    Dec. 23, 2021

(51) Int. Cl.
*H01L 21/768*    (2006.01)
*H01L 23/522*    (2006.01)
(Continued)

(52) U.S. Cl.
CPC .. *H01L 21/76877* (2013.01); *H01L 21/76802* (2013.01); *H01L 23/5226* (2013.01);
(Continued)

(58) Field of Classification Search
CPC ........... H01L 27/11582; H01L 27/1157; H01L 27/11556; H01L 27/11565; H01L 27/11519
See application file for complete search history.

(56) References Cited

U.S. PATENT DOCUMENTS 4,925,809 A    5/1990    Yoshiharu et al.
6,165,247 A    12/2000   Kodas et al.
(Continued)

FOREIGN PATENT DOCUMENTS

CN    107768376 A    3/2018
CN    107887395 A    4/2018
(Continued)

OTHER PUBLICATIONS

Choe et al., YMTC is China's First Mass Producer of 3D NAND Flash Memory Chips, https://www.techinsights.com/blog/ymtc-chinas-first-mass-producer-3d-nand-flash-memory-chips, (Mar. 12, 2020), 3 pages.

(Continued)

*Primary Examiner* — Tony Tran
(74) *Attorney, Agent, or Firm* — TraskBritt

(57) ABSTRACT

A method of forming a microelectronic device comprises forming line structures comprising conductive material and insulative material overlying the conductive material, the line structures separated from one another by trenches. An isolation material is formed on surfaces of the line structures inside and outside of the trenches, the isolation material only partially filling the trenches to form air gaps interposed between the line structures. Openings are formed to extend through the isolation material and expose portions of the insulative material of the line structures. The exposed portions of the insulative material of the line structures are removed to form extended openings extending to the conductive material of the line structures. Conductive contact structures are formed within the extended openings. Conductive pad structures are formed on the conductive contact structures. Additional methods, microelectronic devices, memory devices, and electronic systems are also described.

6 Claims, 12 Drawing Sheets

(51) Int. Cl.
*H01L 23/532* (2006.01)
*H10B 41/27* (2023.01)
*H10B 43/27* (2023.01)

(52) U.S. Cl.
CPC .. *H01L 23/53214* (2013.01); *H01L 23/53228* (2013.01); *H10B 41/27* (2023.02); *H10B 43/27* (2023.02)

(56) References Cited

U.S. PATENT DOCUMENTS

| | | |
|---|---|---|
| 7,372,091 B2 | 5/2008 | Leslie |
| 7,897,485 B2 | 3/2011 | Parekh |
| 8,042,082 B2 | 10/2011 | Solomon |
| 8,958,228 B2 | 2/2015 | Samachisa et al. |
| 9,196,753 B2 | 11/2015 | Ramaswamy et al. |
| 9,397,145 B1 | 7/2016 | Sills et al. |
| 9,449,652 B2 | 9/2016 | Juengling |
| 9,515,083 B2 | 12/2016 | Lee et al. |
| 9,530,790 B1 | 12/2016 | Lu et al. |
| 9,553,263 B1 | 1/2017 | Petz et al. |
| 9,590,012 B2 | 3/2017 | Lee et al. |
| 9,653,617 B2 | 5/2017 | Zhou et al. |
| 9,922,716 B2 | 3/2018 | Hsiung et al. |
| 10,141,330 B1 | 11/2018 | Lindsay et al. |
| 10,283,703 B2 | 5/2019 | Pellizzer et al. |
| 10,381,362 B1 | 8/2019 | Cui et al. |
| 10,665,580 B1 | 5/2020 | Hosoda et al. |
| 10,847,220 B2 | 11/2020 | Castro |
| 11,282,815 B2 | 3/2022 | Parekh et al. |
| 2003/0113669 A1 | 6/2003 | Cheng et al. |
| 2003/0151083 A1 | 8/2003 | Matsui et al. |
| 2005/0265076 A1 | 12/2005 | Forbes |
| 2006/0076690 A1 | 4/2006 | Khandros et al. |
| 2007/0288702 A1 | 12/2007 | Roohparvar |
| 2008/0019165 A1 | 1/2008 | Lin et al. |
| 2009/0168482 A1 | 7/2009 | Park et al. |
| 2011/0159645 A1 | 6/2011 | Pekny |
| 2011/0309431 A1 | 12/2011 | Kidoh et al. |
| 2012/0047321 A1 | 2/2012 | Yoon et al. |
| 2012/0161094 A1 | 6/2012 | Huo et al. |
| 2012/0181602 A1 | 7/2012 | Fukuzumi et al. |
| 2012/0224426 A1 | 9/2012 | Nam et al. |
| 2013/0126622 A1 | 5/2013 | Finn |
| 2013/0130468 A1 | 5/2013 | Higashitani et al. |
| 2014/0001583 A1 | 1/2014 | Teh et al. |
| 2014/0061750 A1 | 3/2014 | Kwon et al. |
| 2014/0063938 A1 | 3/2014 | Oh et al. |
| 2014/0124726 A1* | 5/2014 | Oh ............... H01L 27/2463 257/4 |
| 2014/0175637 A1 | 6/2014 | Stuber et al. |
| 2014/0204675 A1 | 7/2014 | Cho et al. |
| 2015/0091180 A1 | 4/2015 | Ong et al. |
| 2015/0243708 A1 | 8/2015 | Ravasio et al. |
| 2015/0278675 A1 | 10/2015 | Finn et al. |
| 2016/0049201 A1 | 2/2016 | Lue et al. |
| 2016/0079164 A1 | 3/2016 | Fukuzumi et al. |
| 2016/0104715 A1 | 4/2016 | Pachamuthu et al. |
| 2016/0268304 A1 | 9/2016 | Ikeda et al. |
| 2016/0343727 A1 | 11/2016 | Kim et al. |
| 2017/0025421 A1 | 1/2017 | Sakakibara et al. |
| 2017/0054036 A1 | 2/2017 | Dorhout et al. |
| 2017/0092649 A1 | 3/2017 | Takaoka |
| 2017/0148802 A1 | 5/2017 | Dorhout et al. |
| 2018/0053768 A1 | 2/2018 | Kim et al. |
| 2018/0108741 A1 | 4/2018 | Li et al. |
| 2018/0158689 A1 | 6/2018 | Mumford |
| 2019/0043836 A1 | 2/2019 | Fastow et al. |
| 2019/0088493 A1 | 3/2019 | Watanabe et al. |
| 2019/0096906 A1 | 3/2019 | Lindsay et al. |
| 2019/0206861 A1 | 7/2019 | Beigel et al. |
| 2019/0221557 A1 | 7/2019 | Kim et al. |
| 2019/0229089 A1 | 7/2019 | Zhou et al. |
| 2019/0355786 A1 | 11/2019 | Iguchi |
| 2020/0006380 A1 | 1/2020 | Van et al. |
| 2020/0013792 A1 | 1/2020 | Parekh et al. |
| 2020/0013798 A1 | 1/2020 | Parekh |
| 2020/0066745 A1 | 2/2020 | Yu et al. |
| 2020/0083245 A1 | 3/2020 | Fayrushin et al. |
| 2020/0098776 A1 | 3/2020 | Sugisaki |
| 2020/0135541 A1 | 4/2020 | Wu et al. |
| 2020/0159133 A1 | 5/2020 | Yan et al. |
| 2020/0161295 A1 | 5/2020 | Sills et al. |
| 2020/0185406 A1 | 6/2020 | Li et al. |
| 2020/0219815 A1 | 7/2020 | Elsherbini et al. |
| 2020/0227397 A1 | 7/2020 | Yada et al. |
| 2020/0258816 A1 | 8/2020 | Okina et al. |
| 2020/0258876 A1 | 8/2020 | Hosoda et al. |
| 2020/0258904 A1 | 8/2020 | Kai et al. |
| 2020/0273840 A1 | 8/2020 | Elsherbini et al. |
| 2021/0074711 A1 | 3/2021 | Suzuki et al. |
| 2021/0082939 A1 | 3/2021 | Matsuda |
| 2021/0134778 A1 | 5/2021 | Huang et al. |
| 2021/0296316 A1 | 9/2021 | Zhu |
| 2021/0343690 A1 | 11/2021 | Salmon |
| 2022/0028830 A1 | 1/2022 | Kirby |

FOREIGN PATENT DOCUMENTS

| | | |
|---|---|---|
| CN | 108447865 A | 8/2018 |
| CN | 111247636 A | 6/2020 |
| JP | 2002-103299 A | 4/2002 |
| KR | 10-2009-0034570 A | 4/2009 |
| KR | 10-2014-0117062 A | 10/2014 |
| KR | 10-2015-0085155 A | 7/2015 |
| KR | 10-2020-0008606 A | 1/2020 |
| KR | 10-2020-0037444 A | 4/2020 |
| TW | 201511319 A | 3/2015 |
| TW | 201826556 A | 7/2018 |
| TW | 201941407 B | 10/2019 |
| TW | 201946057 A | 12/2019 |
| TW | 202008568 B | 2/2020 |
| WO | 2008/063251 A2 | 5/2008 |

OTHER PUBLICATIONS

Li et al., Skybridge-3D-CMOS: A Fine-Grained 3D CMOS Integrated Circuity Technology, IEEE Transactions on Nanotechnology, vol. 16, No. 4, Jul. 2017, pp. 639-652.
Micron, Introducing 2nd Generation Micron Mobile TLC 3D NAND, Industry-Leading Storage Solutions for Flagship Smartphones, (2018), 9 pages.
YMTC, About Xtacking, http://www.ymtc.com, visited Apr. 20, 2020, 3 pages.
International Search Report for Application No. PCT/US2021/033079, dated Sep. 7, 2021, 3 pages.
Written Opinion of the International Searching Authority for Application No. PCT/US2021/033079, dated Sep. 7, 2021, 5 pages.
Taiwanese First Office Action for Application No. 110119678, dated Jan. 28, 2022, 7 pages.

* cited by examiner

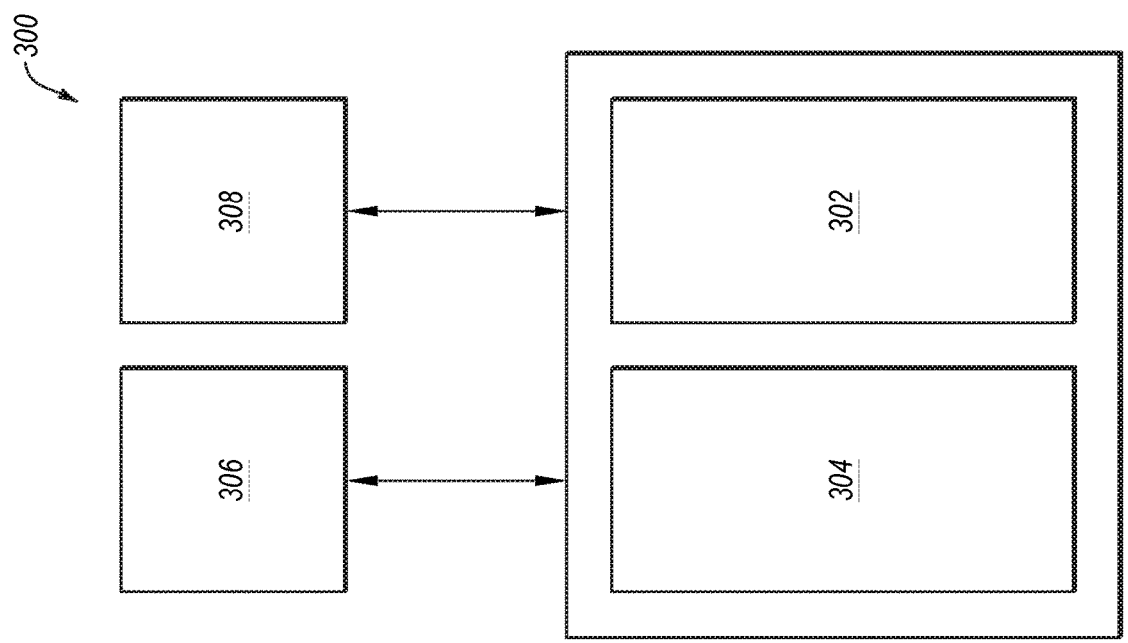

METHODS OF FORMING MICROELECTRONIC DEVICES, AND RELATED MICROELECTRONIC DEVICES, MEMORY DEVICES, ELECTRONIC SYSTEMS, AND ADDITIONAL METHODS

CROSS-REFERENCE TO RELATED APPLICATIONS

This application is related to U.S. patent application Ser. No. 16/905,385, filed Jun. 18, 2020, now U.S. Pat. No. 11,563,018, issued Jan. 24, 2023, listing Kunal R. Parekh as inventor, for "MICROELECTRONIC DEVICES, AND RELATED METHODS, MEMORY DEVICES, AND ELECTRONIC SYSTEMS." This application is also related to U.S. patent application Ser. No. 16/905,698, filed Jun. 18, 2020, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,747, filed Jun. 18, 2020, now U.S. Pat. No. 11,557,569, issued Jan. 17, 2023, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,763, filed Jun. 18, 2020, now U.S. Pat. No. 11,335,602, issued May 17, 2022, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,734, filed Jun. 18, 2020, now U.S. Pat. No. 11,380,669, issued Jul. 5, 2022, listing Kunal R. Parekh as inventor, for "METHODS OF FORMING MICROELECTRONIC DEVICES, AND RELATED BASE STRUCTURES FOR MICROELECTRONIC DEVICES." The disclosure of each of the foregoing documents is hereby incorporated herein in its entirety by reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, electronic systems, and additional methods.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFT speed, lower threshold switching voltage requirements, faster data transfer rates, lower power consumption) of the memory device.

BRIEF DESCRIPTION OF THE DRAWINGS

FIG. 9 is a schematic block diagram of an electronic system, in accordance with an embodiment of the disclosure.

DETAILED DESCRIPTION

Figure 1A:
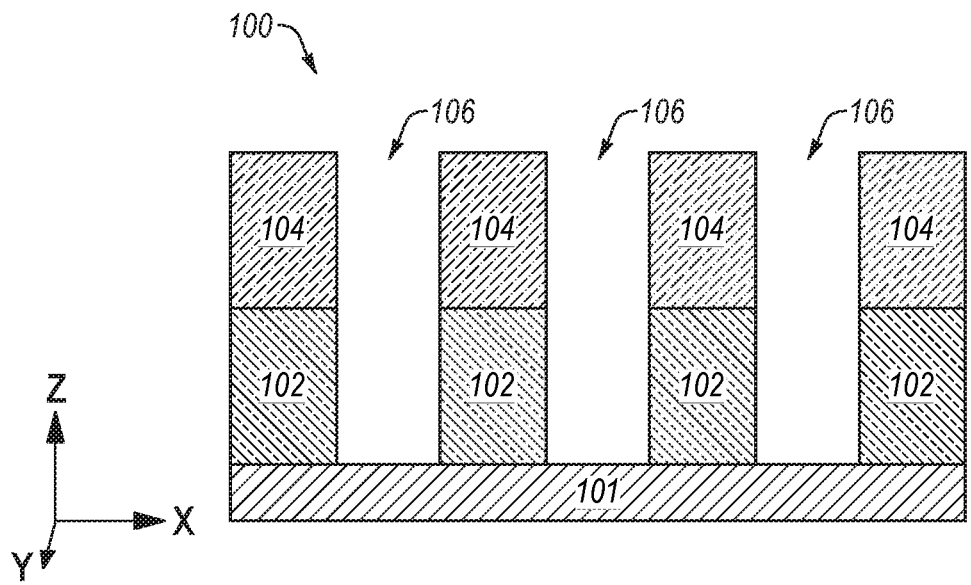
FIGS. 1A through 6B are simplified, partial cross-sectional (FIGS. 1A, 2A, 3A, 4A, 5A, and 6A) and simplified, partial plan (FIGS. 1B, 2B, 3B, 4B, 5B, and 6B) views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g, closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization, or other known methods.

FIGS. 1A through 6B are simplified partial cross-sectional (i.e., FIGS. 1A, 2A, 3A, 4A, 5A, and 6A) and simplified partial plan (i.e., FIGS. 1B, 2B, 3B, 4B, 5B, and 6B) views illustrating embodiments of a method of forming a microelectronic device structure (e.g., a memory device structure) for a microelectronic device (e.g., a memory device, such as a 3D NAND Flash memory device). With the description as provided below, it will be readily apparent to one of ordinary skill in the art that the methods described herein may be used in various applications. In other words, the methods of the disclosure may be used whenever it is desired to form a microelectronic device.

Figure 1B:
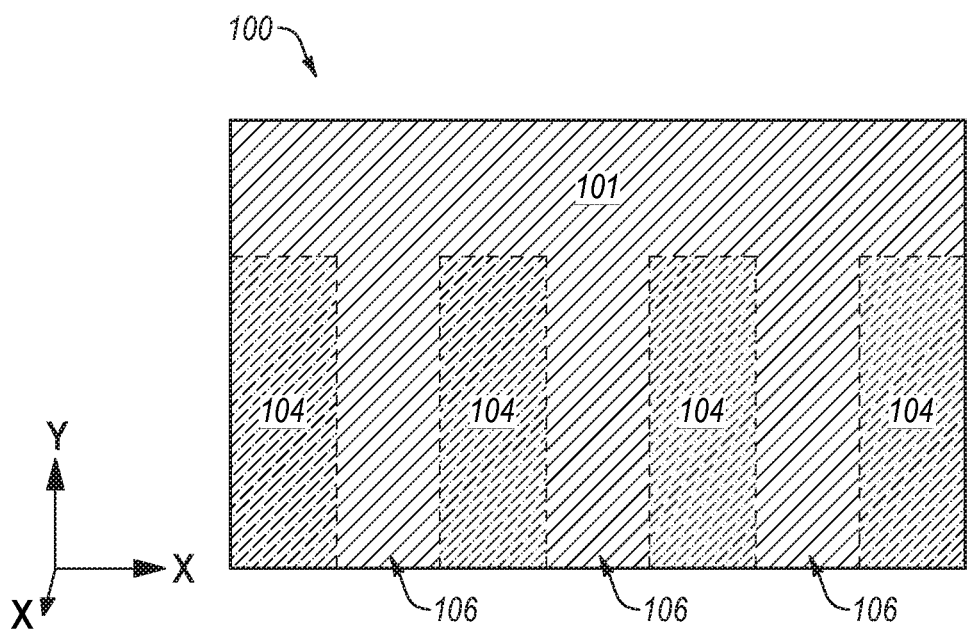

Referring to FIG. 1A, a microelectronic device structure 100 may be formed to include conductive line structures 102 on or over a base structure 101, insulative line structures 104 on or over the conductive line structures 102, and trenches 106 horizontally alternating (e.g., in the X-direction) with the conductive line structures 102 (and, hence, the insulative line structures 104). The base structure 101, the conductive line structures 102, the insulative line structures 104, and the trenches 106 are described in further detail below. FIG. 1B is a simplified plan view of the microelectronic device structure 100 at the process stage depicted in FIG. 1A.

The base structure 101 may comprise a base material or construction upon which additional materials may be formed. The base structure 101 may be formed of and include one or more of a semiconductive material, a conductive material, and a dielectric material. For example, the base structure 101 may comprise a semiconductive structure (e.g., a semiconductor substrate); a base semiconductive material on a supporting structure; a conductive structure (e.g., a metal electrode); a dielectric structure; a structure including one or more of different materials, structures, and regions; another base material; or another construction. In some embodiments, the base structure 101 comprises a stack structure for a memory device (e.g., a 3D NAND Flash memory device), as described in further detail below. The stack structure may, for example, include a vertically alternating sequence of conductive structures and insulative structures arrange in tiers.

The conductive line structures 102 may exhibit horizontally elongate shapes extending in parallel in a first horizontal direction (e.g., the Y-direction). As used herein, the term "parallel" means substantially parallel. The conductive line structures 102 may each exhibit substantially the same dimensions (e.g., width in the X-direction, length in a Y-direction, height in the Z-direction), shape, and spacing (e.g., in the X-direction). In additional embodiments, one or more of the conductive line structures 102 may exhibit one or more of at least one different dimension (e.g., a different length, a different width, a different height) and a different shape than one or more other of the conductive line structures 102, and/or the spacing (e.g., in the X-direction) between at least two horizontally neighboring conductive line structures 102 may be different than the spacing between at least two other horizontally neighboring conductive line structures 102. In some embodiments, the conductive line structures 102 are employed as digit line structures (e.g., data line structures, bit line structures) for a memory device, as described in further detail below.

The conductive line structures 102 may be formed of and include conductive material. By way of non-limiting example, the conductive line structures 102 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive line structures 102 are each individually formed of and include W. Each of the conductive line structures 102 may individually be substantially homogeneous, or one or more of the conductive line structures 102 may individually be substantially heterogeneous. As used herein, the term "homogeneous" means relative amounts of elements included in a feature (e.g., a structure, a material) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a conductive line structure 102 is heterogeneous, amounts of one or more elements included in the conductive line structure 102 may vary stepwise (e.g., change abruptly), or may vary continuously (e.g., change progressively, such as linearly, parabolically) throughout different portions of the conductive line structure 102. In some embodiments, each of the conductive line structures 102 is substantially homogeneous. In additional embodiments, each of the conductive line structure 102 is heterogeneous. Each conductive line structure 102 may, for example, be formed of and include a stack (e.g., laminate) of at least two different conductive materials.

As shown in FIG. 1A, the insulative line structures 104 may vertically overlie (e.g., directly vertically overlie) the conductive line structures 102. The insulative line structures 104 may serve as insulative cap structures (e.g., dielectric cap structures) for the conductive line structures 102. The insulative line structures 104 may have horizontally elongate shapes extending in parallel in the first horizontal direction (e.g., the Y-direction). Horizontal dimensions, horizontal pathing, and horizontal spacing of the insulative line structures 104 may be substantially the same as the horizontal dimensions, horizontal pathing, and horizontal spacing of the conductive line structures 102.

The insulative line structures 104 may be formed of and include insulative material. By way of non-limiting example, the insulative line structures 104 may each individually be formed of and include a dielectric nitride material, such as $SiN_y$ (e.g., $Si_3N_4$). The insulative line structures 104 may each be substantially homogeneous, or one or more of the insulative line structures 104 may be heterogeneous. If an insulative line structure 104 is heterogeneous, amounts of one or more elements included in the insulative line structure 104 may vary stepwise (e.g., change abruptly), or may vary continuously (e.g., change progressively, such as linearly, parabolically) throughout different portions of the insulative line structure 104. In some embodiments, each of the insulative line structures 104 is substantially homogeneous. In additional embodiments, each of the insulative line structures 104 is heterogeneous. Each insulative line structures 104 may, for example, be formed of and include a stack (e.g., laminate) of at least two different dielectric materials.

With continued reference to FIG. 1A, the trenches 106 may horizontally intervene (e.g., in the X-direction) between and separate horizontally neighboring conductive line structures 102 (and, hence, horizontally neighboring insulative line structures 104). The trenches 106 may extend in parallel in the horizontal direction (e.g., the Y-direction) in which the conductive line structures 102 extend. In addition, as shown in FIG. 1A, the trenches 106 may vertically extend (e.g., in the Z-direction) from upper vertical boundaries (e.g., upper surfaces) of the insulative line structures 104 to lower vertical boundaries (e.g., lower surfaces) of the conductive line structures 102. Side surfaces of the conductive line structures 102 and the insulative line structures 104 may define horizontal boundaries of the trenches 106, lower surface of the conductive line structures 102 may define lower vertical boundaries of the trenches 106, and upper surfaces of the insulative line structures 104 may define upper vertical boundaries of the trenches 106.

The conductive line structures 102, insulative line structures 104, and the trenches 106 may be formed using conventional processes (e.g., conventional deposition processes, such as one or more of in situ growth, spin-on coating, blanket coating, CVD, PECVD, ALD, and PVD; conventional patterning processes, such as conventional photolithography processes; conventional material removal processes, such as conventional etching processes) and conventional processing equipment, which are not described in detail herein.

Figure 2A:
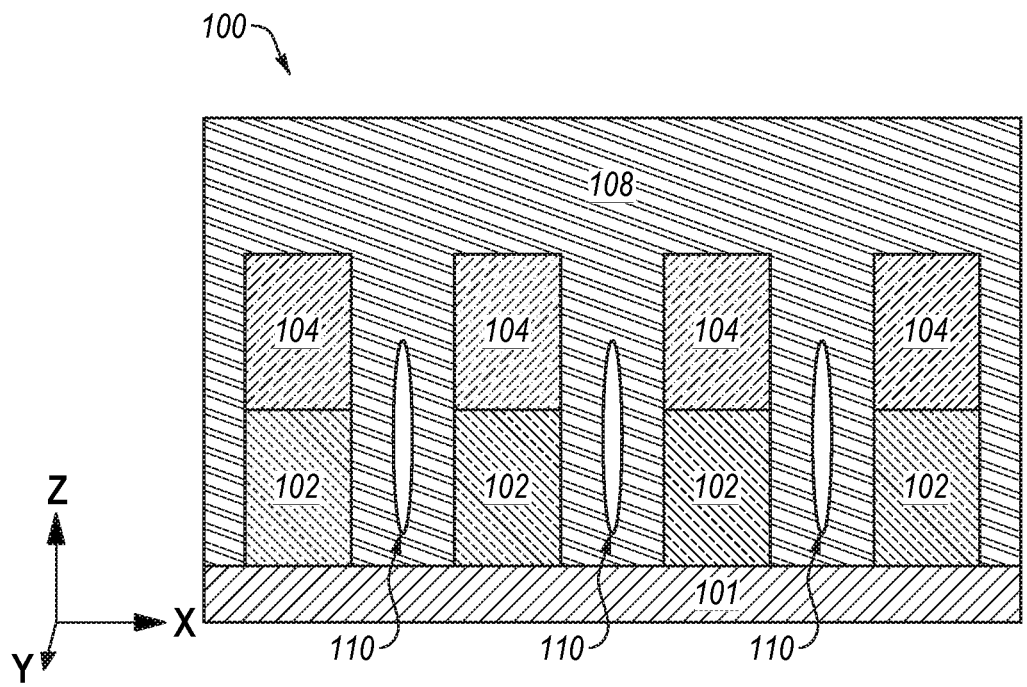
Figure 2B:
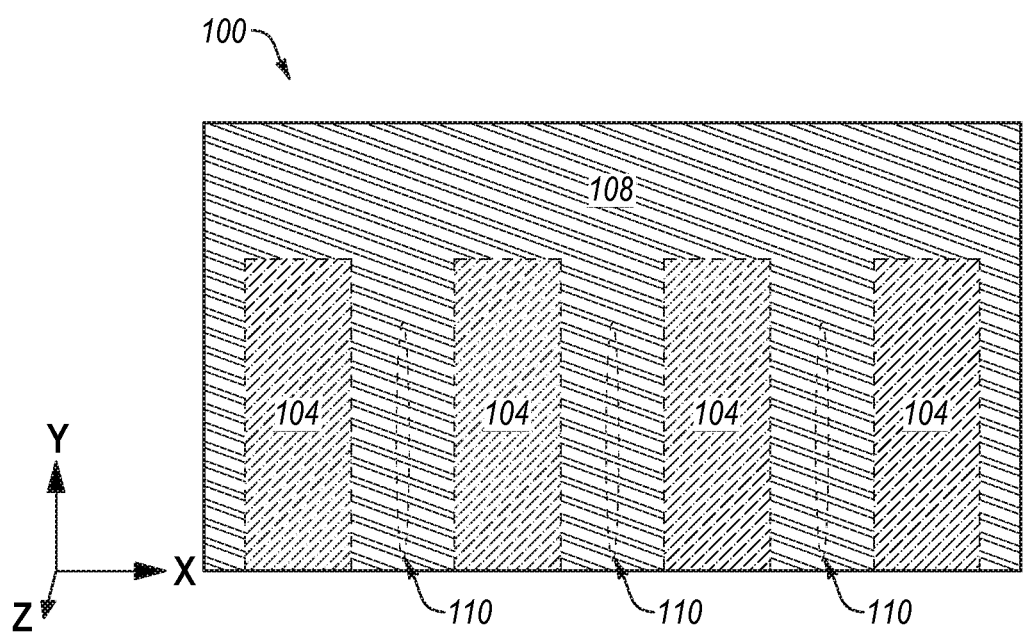

Referring next to FIG. 2A, an isolation material 108 may be formed over exposed surfaces of the microelectronic device structure 100. The isolation material 108 may exhibit a substantially planar upper boundary (e.g., upper surface), and a non-planar lower boundary at least partially defined by the topography of the surfaces (e.g., upper surfaces, side surfaces) of the base structure 101, the conductive line structures 102, and the insulative line structures 104. The isolation material 108 may partially (e.g., less than completely) fill the trenches 106 (FIGS. 1A and 1B). Accordingly, as shown in FIG. 2A, air gaps 110 corresponding to portions of the trenches 106 (FIGS. 1A and 1B) remaining unfilled with the isolation material 108 may horizontally intervene (e.g., in the X-direction) between horizontally neighboring conductive line structures 102 and horizontally neighboring insulative line structures 104 following the formation of the isolation material 108. The air gaps 110 may serve as an insulator having a dielectric constant (k) of about 1. The air gaps 110 may limit capacitance (e.g., parasitic capacitance, stray capacitance) and increase shorts margin between horizontally neighboring conductive line structures 102, and may reduce cross-talk between horizontally neighboring conductive line structures 102. FIG. 2B is a simplified plan view of the microelectronic device structure 100 at the process stage depicted in FIG. 2A.

The isolation material 108 may be formed of and include at least one insulative material. By way of non-limiting example, the isolation material 108 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 108 is formed of and includes $SiO_x$ (e.g., Sift).

As shown in FIG. 2A, the air gaps 110 may vertically extend (e.g., in the Z-direction) from a location vertically at or vertically below upper vertical boundaries of the insulative line structures 104 to additional locations vertically at or vertically above lower vertical boundaries of the conductive line structures 102. In some embodiments, the air gaps 110 vertically extend from locations vertically below upper surfaces of the insulative line structures 104 and vertically above upper surfaces of the conductive line structures 102 to additional locations vertically above lower surfaces of the conductive line structures 102. The air gaps 110 may each individually be substantially surrounded by (e.g., buried within, embedded within) the isolation material 108. In addition, the air gaps 110 may be positioned about horizontal centerlines (e.g., in the X-direction) of the trenches 106 (FIG. 1A), and may horizontally extend (e.g., in the X-direction) outward from the horizontal centerlines of the trenches 106 (FIG. 1A).

The isolation material 108 and the air gaps 110 may be formed using conventional processes (e.g., conventional deposition processes, conventional material removal processes) and conventional processing equipment, which are not described in detail herein. For example, the isolation material 108 (and, hence, the air gaps 110) may be formed on or over portions of the exposed surfaces of the microelectronic device structure 100 using one or more conventional non-conformal deposition processes (e.g., at least one conventional non-conformal PVD process). Thereafter, the isolation material 108 may be subjected to at least one conventional planarization process (e.g., at least one conventional CMP process) to facilitate or enhance the planarity of an upper boundary (e.g., upper surface) of the isolation material 108. Forming the air gaps 110 in the manner described above may effectuate a reduction in undesirable capacitive coupling between horizontally neighboring electrically conductive features (e.g., the conductive line structures 102) of the microelectronic device structure 100, while circumventing undesirable damage to the horizontally neighboring electrically conductive features that may be otherwise occur if the air gaps 110 were formed through other processes, such as by etching insulative material formed between the conductive line structures 102. Thus, forming the air gaps 110 in manner described above may preserve the integrity of both the horizontally neighboring electrically conductive features and the air gaps 110.

Figure 3A:
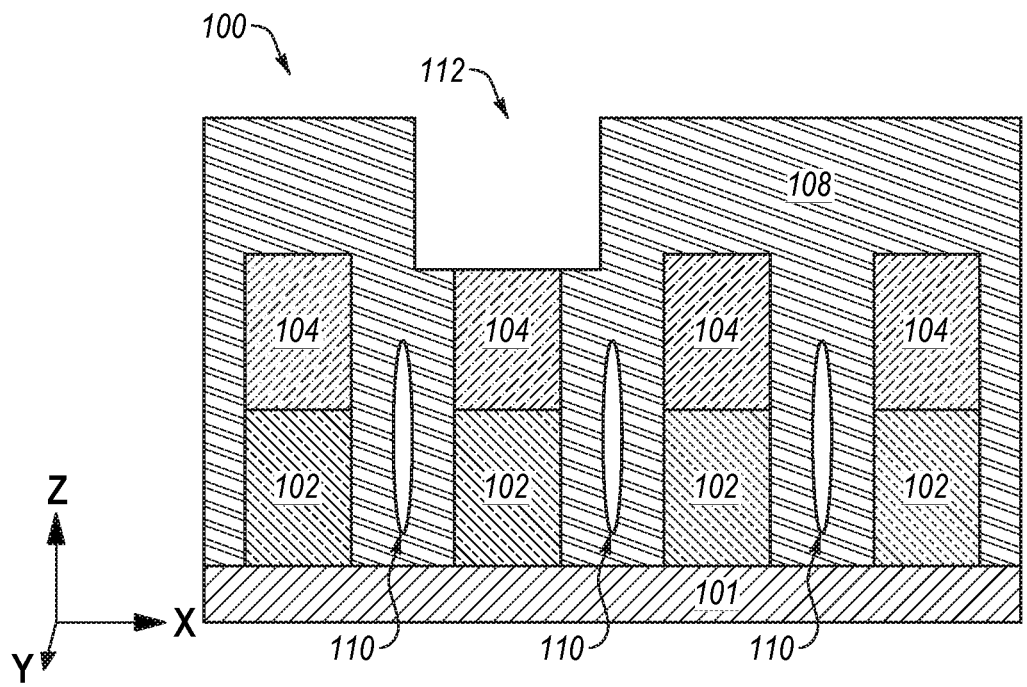
Figure 3B:
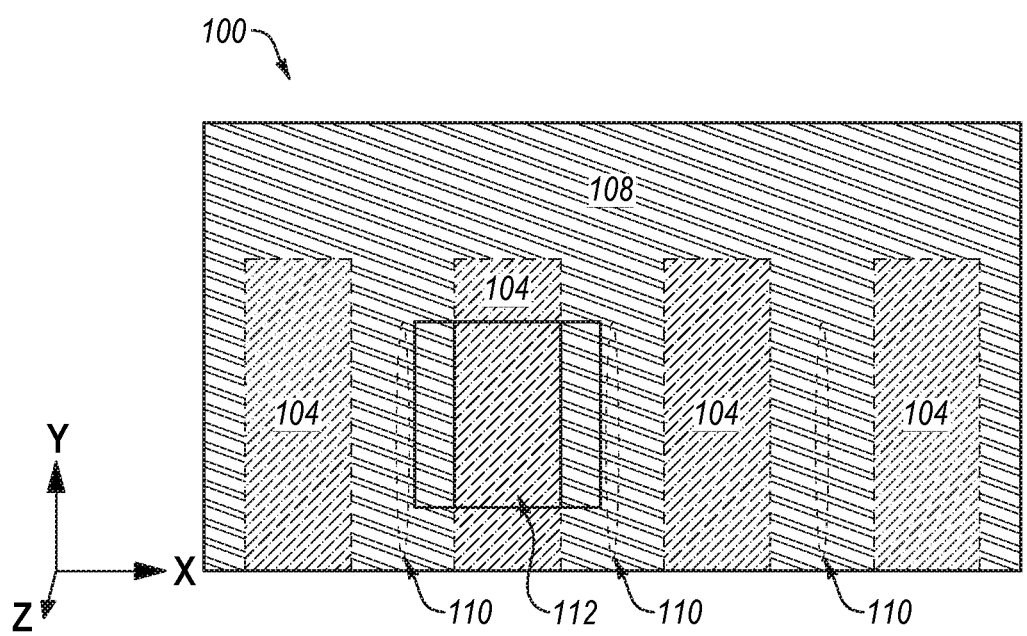

Referring next to FIG. 3A, portions of the isolation material 108 vertically overlying the insulative line structures 104 may be removed (e.g., etched) to expose (e.g., uncover) portions of the insulative line structures 104. As shown in FIG. 3A, the material removal process may form openings 112 vertically extending (e.g., in the Z-direction) from an upper surface of the isolation material 108 to the insulative line structures 104. In some embodiments, the material removal process removes predetermined portions of the isolation material 108 without removing portions of the insulative line structures 104. In additional embodiments, the material removal process removes the predetermined portions of the isolation material 108 and also partially removes portions of the insulative line structures 104 vertically underlying and horizontally overlapping (e.g., at least partially horizontally aligned with) the predetermined portions of the isolation material 108. FIG. 3B is a simplified plan view of the microelectronic device structure 100 at the process stage depicted in FIG. 3A.

As shown in FIG. 3B, individual openings 112 may be at least partially (e.g., substantially) horizontally aligned in the X-direction with individual insulative line structures 104 (and, hence, individual conductive line structures 102 (FIG. 3A)). For example, horizontal centerlines of the openings 112 in the X-direction may be substantially aligned with horizontal centerlines of the insulative line structures 104 in the X-direction. Each opening 112 may be horizontally positioned between two air gaps 110 horizontally neighboring one another in the X-direction. In addition, individual openings 112 may be positioned at desired locations in the Y-direction along the individual insulative line structures 104 (and, hence, individual conductive line structures 102 (FIG. 3A)). In some embodiments, at least some of the openings 112 are provided at different positions in the Y-direction than one another. For example, a first of the openings 112 may be provided at different position along a length in the Y-direction of a first of the insulative line structures 104 as compared to a position of a second of the openings 112 along a length in the Y-direction of a second of the insulative line structures 104. Put another way, at least some (e.g., all) of the openings 112 may be horizontally offset from one another in the Y-direction. In additional embodiments, two or more of the openings 112 are horizontally aligned with one another in the Y-direction.

The openings 112 may each individually be formed to exhibit geometric configurations (e.g., dimensions, shapes) facilitating desired geometric configurations of additional features (e.g., additional structures, additional materials) to subsequently be formed therein. As shown in FIG. 3B, in some embodiments, individual openings 112 are formed to be relatively wider in the X-direction than individual insulative line structures 104 (and, hence, individual conductive line structures 102 (FIG. 3A)) vertically thereunder. For example, each opening 112 may horizontally extend in the X-direction beyond horizontal boundaries in the X-direction of the insulative line structure 104 associated therewith (e.g., exposed thereby). In some embodiments, a width in the X-direction of each opening 112 is up to two times (2×) a width in the X-direction of the insulative line structure 104 associated therewith, such as within a range of from about one and one quarter times (1.25×) the width in the X-direction of the insulative line structure 104 to about two times (2×) the width in the X-direction of the insulative line structure 104. The openings 112 may horizontally terminate in the X-direction between horizontal boundaries of the insulative line structures 104 and the air gaps 110 horizontally neighboring the insulative line structures 104, such that the openings 112 do not horizontally overlap the air gaps 110; or the openings 112 may horizontally terminate in the X-direction within horizontal boundaries of the air gaps 110 horizontally neighboring the insulative line structures 104, such that the openings 112 partially horizontally overlap the air gaps 110. In additional embodiments, one or more (e.g., each) of the openings 112 are individually formed to exhibit a width in the X-direction less than or equal to a width in the X-direction of the insulative line structure 104 associated therewith. In addition, as shown in FIG. 3B, individual openings 112 may be formed to have lengths in the Y-direction less than lengths in the Y-direction than individual insulative line structures 104 (and, hence, individual conductive line structures 102 (FIG. 3A)) vertically thereunder. In some embodiments, each opening 112 is formed to have a substantially square horizontal cross-sectional shape. In additional embodiments, one or more (e.g., each) of the openings 112 is formed to have a different (e.g., non-square) horizontal cross-sectional shape, such as one or more of a circular horizontal cross-sectional shape, a different tetragonal horizontal cross-sectional shape, an ovular horizontal cross-sectional shape, an elliptical horizontal cross-sectional shape, and a triangular horizontal cross-sectional shape. Each of the openings 112 may be formed to exhibit substantially the same geometric configuration as each other of the openings 112, or one or more of the openings 112 may be formed to exhibit a different geometric configuration than one or more other of the openings 112.

The openings 112 may be formed using one or more conventional material removal processes (e.g., a conventional anisotropic etching process), which are not described in detail herein. For example, predetermined portions of the isolation material 108 may be removed by one or more of anisotropic dry etching (e.g., reactive ion etching (RIE), deep RIE, plasma etching, reactive ion beam etching, chemically assisted ion beam etching) and anisotropic wet etching (e.g., hydrofluoric acid (HF) etching, a buffered HF etching, buffered oxide etching).

Figure 4A:
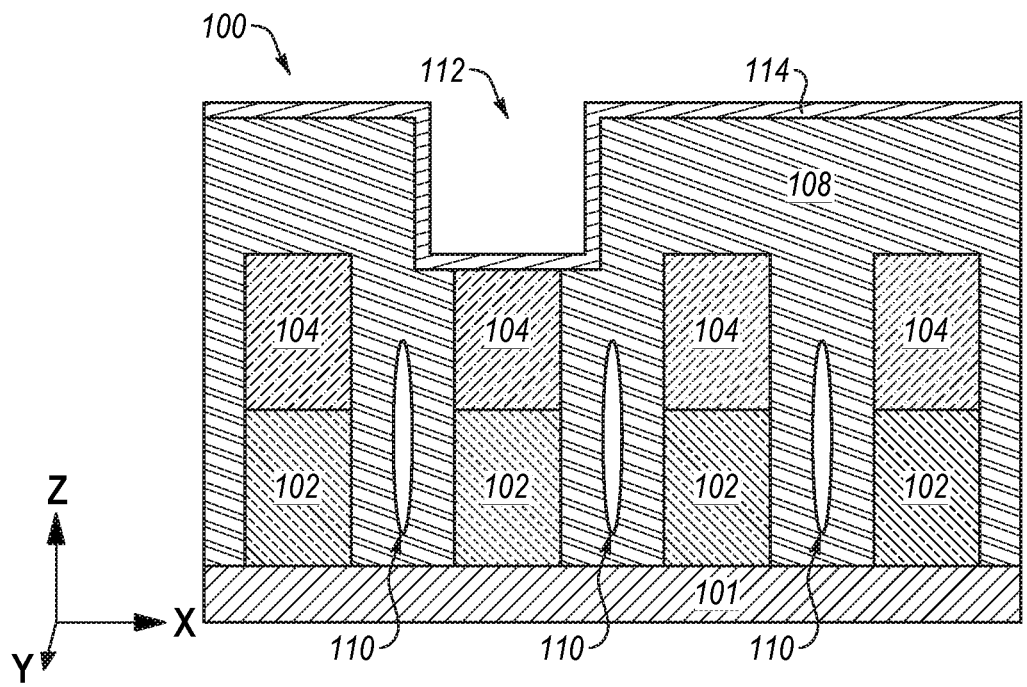
Figure 4B:
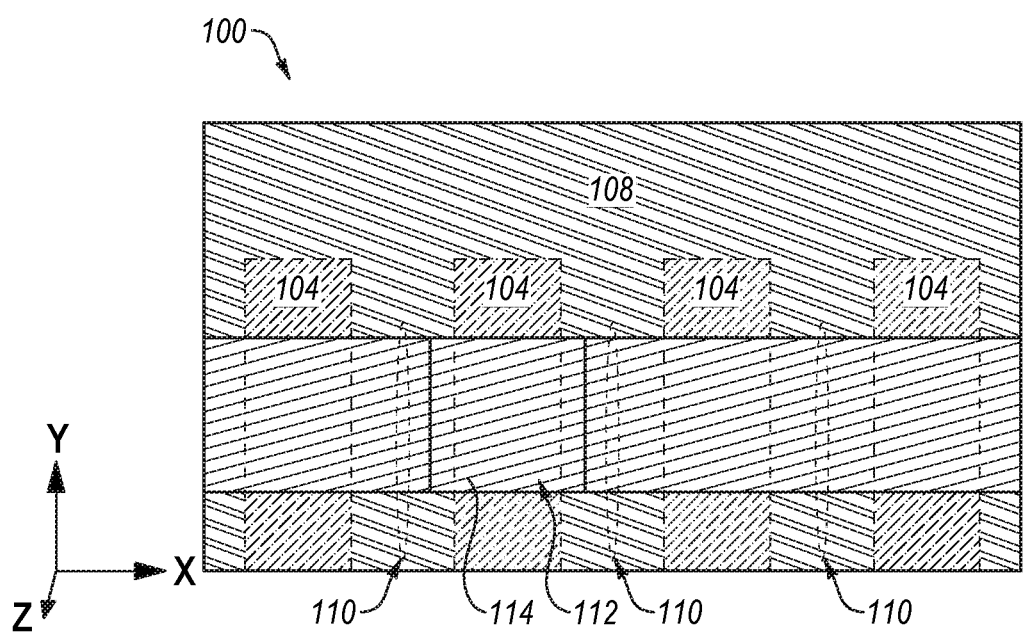

Referring next to FIG. 4A, a spacer material 114 may, optionally, be formed on or over surfaces of the isolation material 108 and the insulative line structures 104 inside and outside of the openings 112. For example, as shown in FIG. 4A, the spacer material 114 may be conformally formed on surfaces (e.g., side surfaces) of the isolation material 108 defining horizontal boundaries of the openings 112, on surfaces of the insulative line structures 104 and the isolation material 108 defining lower vertical boundaries of the openings 112, and on surfaces (e.g., upper surfaces) of the isolation material 108 outside of the openings 112. As shown in FIG. 4A, the spacer material 114 (if any) may partially (e.g., less than completely) fill the openings 112. FIG. 4B is a simplified plan view of the microelectronic device structure 100 at the process stage depicted in FIG. 4A. For clarity and ease of understanding the drawings and associated description, portions of the spacer material 114 outside of the horizontal boundaries of the openings 112 are omitted in FIG. 4B. However, as shown in FIG. 4A and as described above, the spacer material 114 (if any) may be formed to horizontally extend beyond the horizontal boundaries of the openings 112.

The spacer material 114, if any, may be formed of and include at least one insulative material having different etch selectivity than the insulative line structures 104. The spacer material 114 may be selectively etchable relative to the insulative line structures 104 during common (e.g., collective, mutual) exposure to a first etchant, and the insulative line structures 104 may be selectively etchable relative to the spacer material 114 during common exposure to a second, different etchant. As used herein, a material is "selectively etchable" relative to another material if the material exhibits an etch rate that is at least about three time (3×) greater than the etch rate of another material, such as about five times (5×) greater, about ten times (10×) greater, about twenty times (20×) greater, or about forty times (40×) greater. By way of non-limiting example, the spacer material 114 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, such as some embodiments wherein the insulative line structures 104 are formed of and include at least one dielectric nitride material (e.g., $SiN_y$, such as $Si_3N_4$), the spacer material 114 is formed of and includes at least one dielectric oxide material (e.g., $SiO_x$, such as $SiO_2$).

The spacer material 114, if any, may be formed to any desired thickness, at least partially depending the horizontal distances (e.g., in the X-direction) between individual insulative line structures 104 (and, hence, the conductive line structures 102) and individual air gaps 110 horizontally neighboring the insulative line structures 104. The spacer material 114 may be employed to form spacer structures that at least partially protect (e.g., preserve, maintain) the air gaps 110 during subsequent processing of the microelectronic device structure 100, as described in further detail below. By way of non-limiting example, the spacer material 114, if any, may be formed to have a thickness within a range of from about 10 nanometers (nm) to about 100 nm, such as from about 20 nm to about 75 nm, or from about 30 nm to about 50 nm. In some embodiments, the spacer material 114 is formed to exhibit a thickness within a range of from about 30 nm to about 50 nm.

The spacer material 114, if any, may be formed using conventional processes and conventional processing equipment, which are not described in detail herein. By way of non-limiting example, the spacer material 114 may be conformally formed on exposed surfaces of the microelectronic device structure 100 through one or more of a conformal CVD process and an ALD process.

Figure 5A:
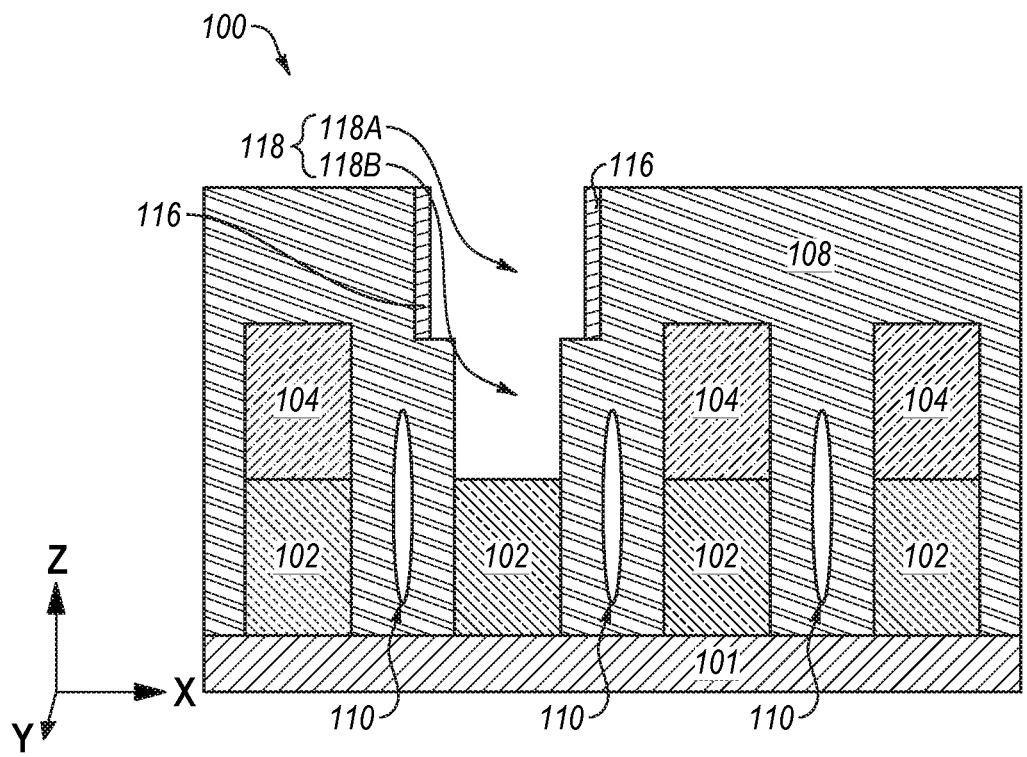
Figure 5B:
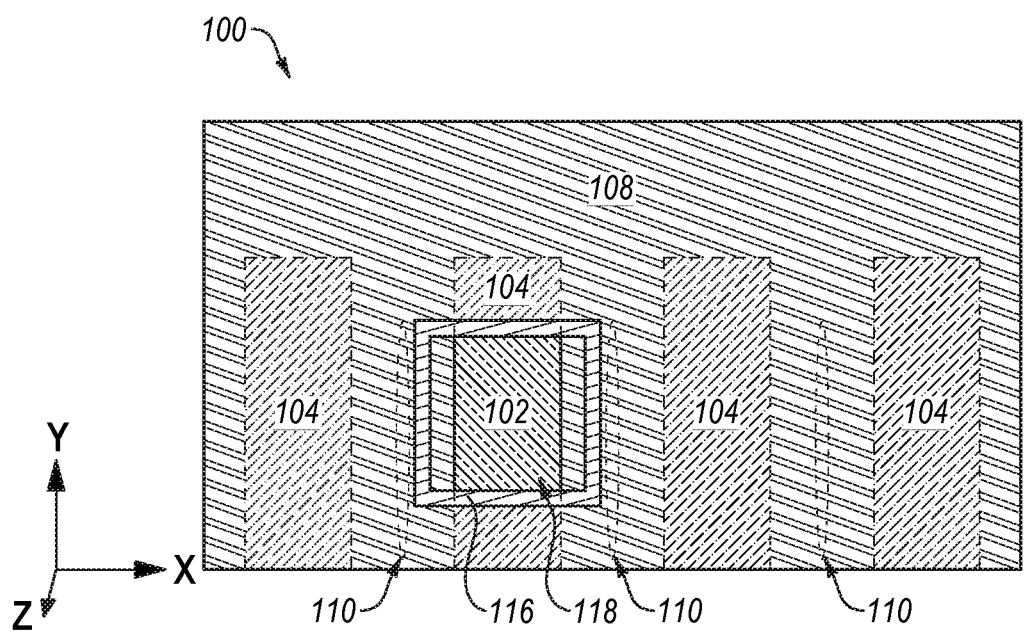

Referring next to FIG. 5A, the spacer material 114 (FIGS. 4A and 4B), if any, and portions of the insulative line structures 104 within horizontal boundaries of the openings 112 (FIGS. 4A and 4B) may be subjected to at least one material removal process to form spacer structures 116 from the spacer material 114 (FIGS. 4A and 4B) and to selectively remove the portions of the insulative line structures 104. As shown in FIG. 5A, the material removal process may form extended openings 118 vertically extending to and exposing (e.g., uncovering) portions of the conductive line structures 102. FIG. 5B is a simplified plan view of the microelectronic device structure 100 at the process stage depicted in FIG. 5A.

As shown in FIG. 5A, the material removal process may substantially (e.g., completely) remove portions of the spacer material 114, if any, on or over upper surfaces of the isolation material 108 outside of the horizontal boundaries of the openings 112 (FIGS. 4A and 4B), and may partially remove portions of the spacer material 114 at lower vertical boundaries of the openings 112. The spacer structures 116, if any, may comprise remaining (e.g., unremoved) portions of the spacer material 114 on side surfaces of the isolation material 108 at horizontal boundaries of the openings 112. In additional embodiments wherein the spacer material 114 is not formed, the spacer structures 116 are omitted (e.g., absent) from the microelectronic device structure 100.

Still referring to FIG. 5A, the material removal process may remove portions of the insulative line structures 104 within horizontal boundaries (e.g., in the X-direction and the Y-direction) of the openings 112 (FIGS. 4A and 4B) to form the extended openings 118. The extended openings 118 may include upper portions 118A comprising remaining (e.g., unfilled) portions of the openings 112 (FIGS. 4A and 4B), and lower portions 118B vertically underlying and continuous with the upper portions 118A. As shown in FIG. 5A, the lower portions 118B of the extended openings 118 may be horizontally narrower in the X-direction than the upper portions 118A of the extended openings 118. In some embodiments, inner side surfaces of the spacer structures 116 define horizontal boundaries of the upper portions 118A of the extended openings 118, and inner side surfaces of the isolation material 108 vertically underlying the spacer structures 116 define horizontal boundaries of the lower portions 118B of the extended openings 118. The extended openings 118 may vertically extend (e.g., in the Z-direction) from an upper vertical boundary (e.g., an upper surface) of the isolation material 108 to upper vertical boundaries (e.g., upper surfaces) of the conductive line structures 102.

The spacer structures 116 (if any) and the extended openings 118 may be formed using conventional processes (e.g., conventional anisotropic etching processes) and conventional processing equipment, which are not described in detail herein. In some embodiments, a first anisotropic dry etching process is employed to remove the portions of the spacer material 114 (FIGS. 4A and 4B) and form the spacer structures 116, and then a second anisotropic dry etching process is used to selectively remove newly exposed (e.g., uncovered) portions of the insulative line structures 104 and form the extended openings 118. The first anisotropic dry etching process may employ a first dry etchant having a higher etch selectivity toward the spacer material 114 (FIGS. 4A and 4B) than the insulative line structures 104; and the second anisotropic dry etching process may employ a second dry etchant having a higher etch selectivity toward the insulative line structures 104 than the spacer material 114 (FIGS. 4A and 4B).

Figure 6A:
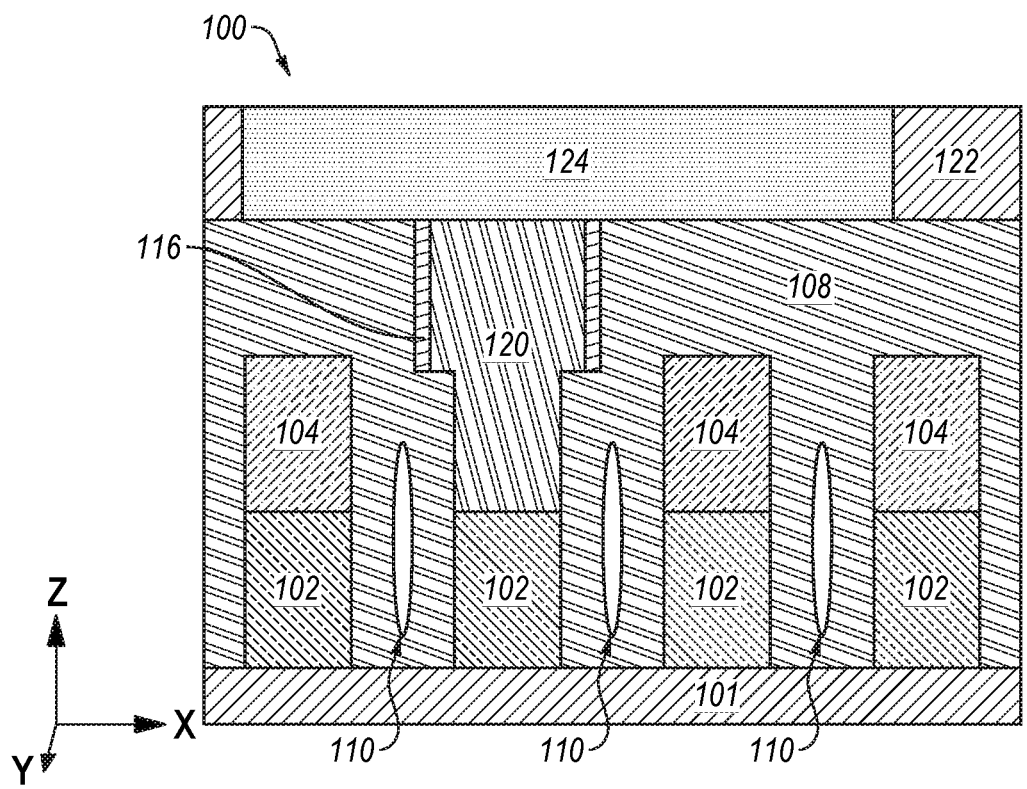
Figure 6B:
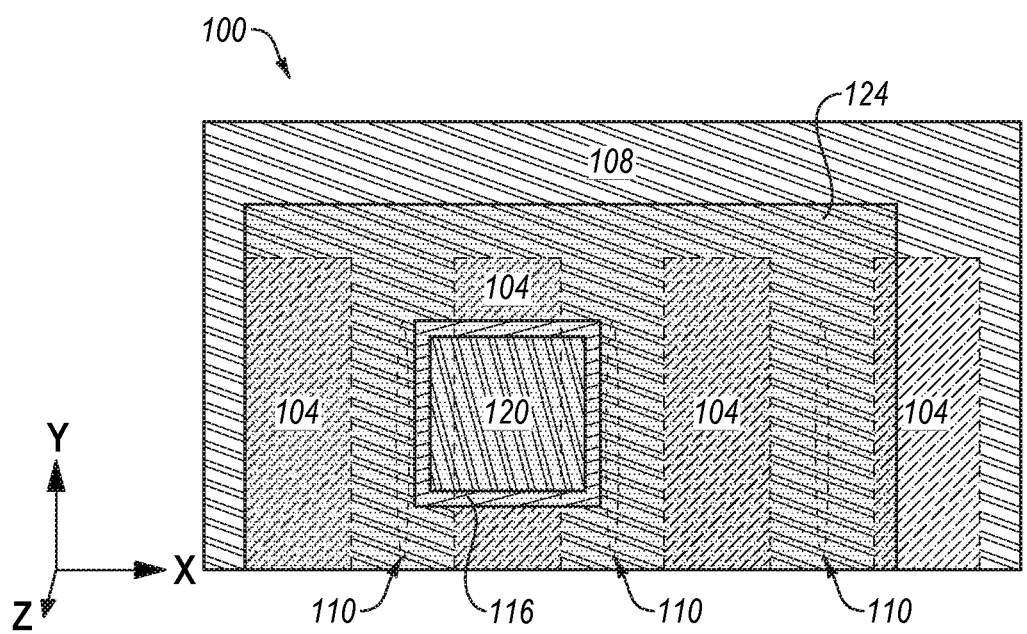

Referring next to FIG. 6A, conductive contact structures 120 may be formed within the extended openings 118 (FIGS. 5A and 5B), and conductive pad structures 124 may be formed on or over the conductive contact structures 120. The conductive contact structures 120 may be substantially confined within boundaries (e.g., horizontal boundaries, vertical boundaries) of the extended openings 118 (FIGS. 5A and 5B), and the conductive pad structures 124 may be at least partially positioned outside of the boundaries of the extended openings 118 (FIGS. 5A and 5B). In addition, an additional isolation material 122 may be formed on or over the isolation material 108, and may horizontally neighbor the conductive pad structures 124. FIG. 6B is a simplified plan view of the microelectronic device structure 100 at the process stage depicted in FIG. 6A. For clarity and ease of understanding the drawings and associated description, the additional isolation material 122 is omitted in FIG. 6B.

As shown in FIG. 6A, the conductive contact structures 120 may substantially fill the extended openings 118 (FIGS. 5A and 5B), and may exhibit substantially planar upper surfaces substantially coplanar with an upper surfaces of the isolation material 108 and the spacer structures 116 (if any). The conductive contact structures 120 may vertically extend (e.g., in the Z-direction) from upper boundaries (e.g., upper surfaces) of the isolation material 108 and the spacer structures 116 (if any) to upper boundaries (e.g., upper surfaces) of the conductive line structures 102. In some embodiments, the dimensions, shapes, and the spacing of the conductive contact structures 120 are respectively substantially the same as the dimensions, shapes, and the spacing of the extended openings 118 (FIGS. 5A and 5B). The conductive contact structures 120 may be coupled to the conductive line structures 102. In some embodiments, the conductive contact structures 120 are employed as digit line contact structures (e.g., data line contact structures, bit line contact structures) for a memory device, as described in further detail below.

The conductive contact structures 120 may each individually be formed of and include conductive material. By way of non-limiting example, the conductive contact structures 120 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the conductive contact structures 120 are formed of and include Cu. In additional embodiments, the conductive contact structures 120 are formed of and include W.

The conductive contact structures 120 may be formed using conventional processes and conventional processing equipment, which are not described in detail herein. By way of non-limiting example, conductive material may be formed (e.g., non-conformably deposited) inside and outside of the extended openings 118 (FIGS. 5A and 5B), and then portions of the conductive material outside the boundaries (e.g., horizontal boundaries, vertical boundaries) of the extended openings 118 (FIGS. 5A and 5B) may be removed (e.g., through at least one material removal process, such as at least one CMP process) to form the conductive contact structures 120.

With continued reference to FIG. 6A, the additional isolation material 122 may be formed on or over an upper surface of the isolation material 108. The additional isolation material 122 may be formed of and include at least one insulative material. By way of non-limiting example, the additional isolation material 122 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. A material composition of the additional isolation material 122 may be substantially the same as a material composition of the isolation material 108, or the material composition of the additional isolation material 122 may be different than the material composition of the isolation material 108. In some embodiments, the additional isolation material 122 is formed of and includes $SiO_x$ (e.g., $SiO_2$).

The conductive pad structures 124 may be formed on or over surfaces of the conductive contact structures 120, the spacer structures 116 (if any), and the isolation material 108. The conductive pad structures 124 may be formed within and may substantially fill apertures formed within the additional isolation material 122. As shown in FIGS. 6A and 6B, the conductive pad structures 124 may be formed to horizontally extend over multiple insulative line structures 104 (and, hence, over multiple conductive line structures 102) and air gaps 110. Individual conductive pad structures 124 may be coupled to individual conductive contact structures 120. The conductive pad structures 124 may be employed as bond pads to couple the conductive contact structures 120 to additional conductive pad structures and additional conductive contact structures, as described in further detail below.

The conductive pad structures 124 may each individually be formed of and include conductive material. By way of non-limiting example, the conductive pad structures 124 may be formed of and include one or more of at least one metal, at least one alloy, and at least one conductive metal-containing material (e.g., a conductive metal nitride, a conductive metal silicide, a conductive metal carbide, a conductive metal oxide). A material composition of the conductive pad structures 124 may be substantially the same as a material composition of the conductive contact structures 120, or the material composition of the conductive pad structures 124 may be different than the material composition of the conductive contact structures 120. In some embodiments, the conductive pad structures 124 are formed of and include Cu.

The additional isolation material 122 and the conductive pad structures 124 may be formed using conventional processes and conventional processing equipment, which are not described in detail herein. As a non-limiting example, the additional isolation material 122 may be formed (e.g., through at least one material deposition process, such as one or more of an ALD process, a CVD process, a PECVD process, a PVD process, and a spin-coating process) on or over exposed surfaces of the conductive contact structures 120, the spacer structures 116 (if any), and the isolation material 108; apertures may be formed (e.g., etched) within the additional isolation material 122; and then the conductive pad structures 124 may be formed within the apertures through a damascene process. The damascene process may include filling the apertures with conductive material (e.g., through at least one additional material deposition process, such as one or more of an ALD process, a CVD process, a PECVD process, a PVD process, and a spin-coating process), and then removing portions of the conductive material outside boundaries (e.g., horizontal boundaries, vertical boundaries) of the apertures using at least one planarization process (e.g., at least one CMP process). As another non-limiting example, conductive material may be formed (e.g., through at least one material deposition process, such as one or more of an ALD process, a CVD process, a PECVD process, a PVD process, and a spin-coating process) on or over exposed surfaces of the conductive contact structures 120, the spacer structures 116 (if any), and the isolation material 108; portions of the conductive material may be removed (e.g., etched) to form the conductive pad structures 124 through a subtractive process; and then the additional isolation material 122 may be formed (e.g., using at least one material deposition process and at least one planarization process) around the conductive pad structures 124.

The methods of the disclosure described above with reference to FIGS. 1A through 6B may facilitate the self-alignment of the conductive pad structures 124 with the conductive line structures 102, and may avoid or relax overlay constraints as compared to conventional methods of forming conductive bond pad structures over similar conductive line structures. The methods of the disclosure may reduce the number of processing acts (e.g., alignment and masking acts), materials, and structures required to form desirable microelectronic device structures as compared to conventional methods of forming desirable microelectronic device structures.

Thus, in accordance with embodiments of the disclosure, a method of forming a microelectronic device comprises forming line structures comprising conductive material and insulative material overlying the conductive material, the line structures separated from one another by trenches. An isolation material is formed on surfaces of the line structures inside and outside of the trenches, the isolation material only partially filling the trenches to form air gaps interposed between the line structures. Openings are formed to extend through the isolation material and expose portions of the insulative material of the line structures. The exposed portions of the insulative material of the line structures are removed to form extended openings extending to the conductive material of the line structures. Conductive contact structures are formed within the extended openings. Conductive pad structures are formed on the conductive contact structures. Additional methods, microelectronic devices, memory devices, and electronic systems are also described.

Figure 7:
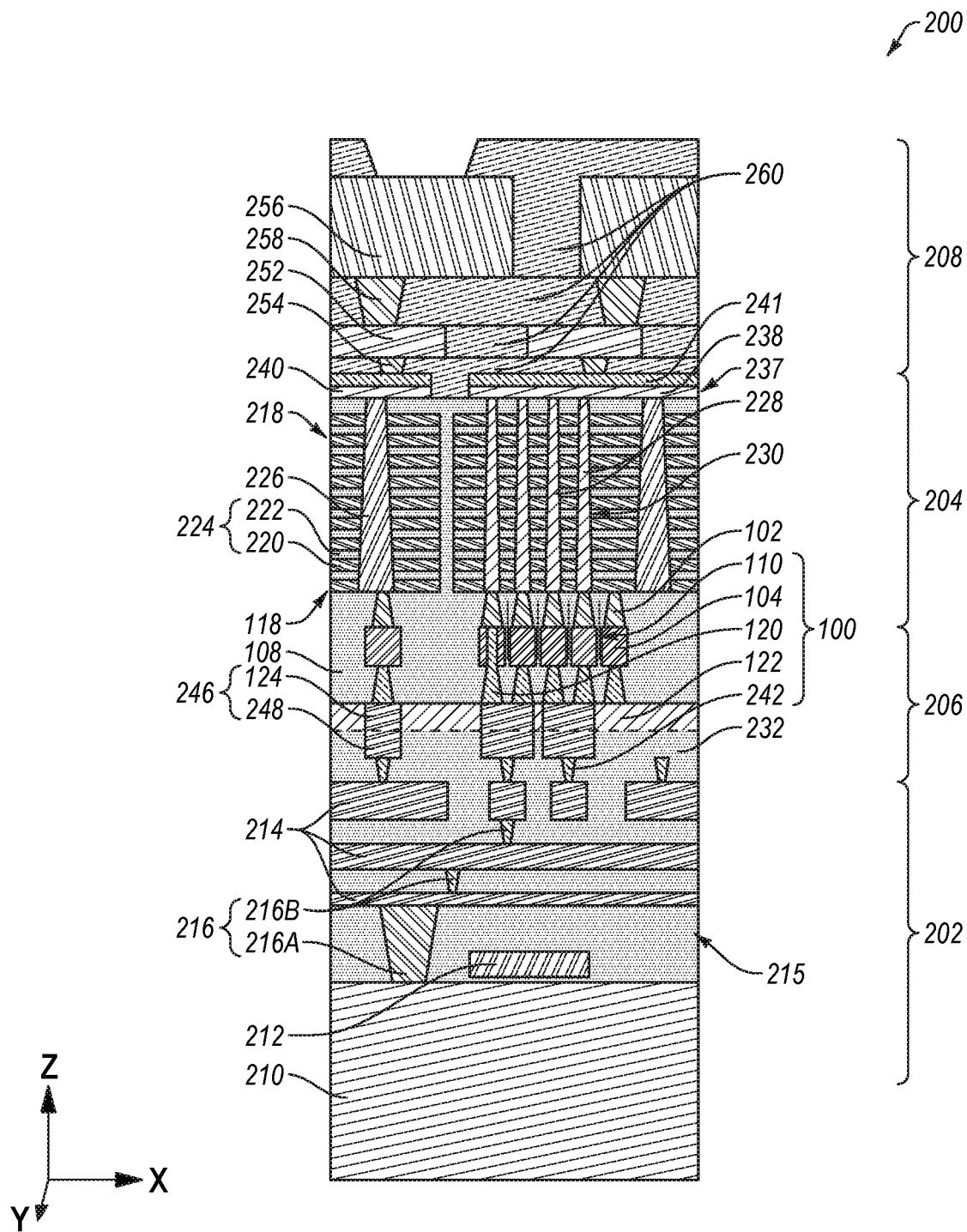
FIG. 7 is simplified, partial cross-sectional view of a microelectronic device including a microelectronic device structure formed through the method described with reference to FIGS. 1A through 6B, in accordance with embodiments of the disclosure.

Microelectronic device structures (e.g., the microelectronic device structure 100 following the process stage described above with reference to FIGS. 6A and 6B) in accordance with embodiments of the disclosure may be employed in microelectronic devices (e.g., a memory device, such as a 3D NAND Flash memory device) of the disclosure. By way of non-limiting example, FIG. 7 is a simplified, partial cross-sectional view of a microelectronic device 200 (e.g., a memory device, such as a 3D NAND Flash memory device), in accordance with embodiments of the disclosure. As shown in FIG. 7 and described in further detail below, the microelectronic device 200 may include the microelectronic device structure 100 resulting from the completion of the process stage previously described with reference to FIGS. 6A and 6B. With the description provided below, it will be readily apparent to one of ordinary skill in the art that microelectronic devices described herein may be included in various relatively larger devices and various electronic systems.

As shown in FIG. 7, the microelectronic device 200 may include a control logic region 202, a memory array region 204, a first interconnect region 206, and a second interconnect region 208. As shown in FIG. 7, the first interconnect region 206 may vertically overlie (e.g., in the Z-direction) and be in electrical communication with the control logic region 202, and the memory array region 204 may vertically overlie and be in electrical communication with the first interconnect region 206. The first interconnect region 206 may be vertically interposed between and in electrical communication with the control logic region 202 and the memory array region 204. In addition, the second interconnect region 208 may vertically overlie and be in electrical communication with the memory array region 204. The memory array region 204 may be vertically interposed between and in electrical communication with the first interconnect region 206 and the second interconnect region 208. The microelectronic device structure 100 previously described with reference to FIGS. 6A and 6B may form portions of the memory array region 204 and the first interconnect region 206 of the microelectronic device 200.

The control logic region 202 of the microelectronic device 200 may include a semiconductive base structure 210, gate structures 212, first routing structures 214, and first contact structures 216. Portions of the semiconductive base structure 210, the gate structures 212, the first routing structures 214, and the first contact structures 216 form various control logic devices 215 of the control logic region 202, as described in further detail below.

The semiconductive base structure 210 (e.g., semiconductive wafer) of the control logic region 202 comprises a base material or construction upon which additional features (e.g., materials, structures, devices) of the microelectronic device 200 are formed. The semiconductive base structure 210 may comprise a semiconductive structure (e.g., a semiconductive wafer), or a base semiconductive material on a supporting structure. For example, the semiconductive base structure 210 may comprise a conventional silicon substrate (e.g., a conventional silicon wafer), or another bulk substrate comprising a semiconductive material. In some embodiments, the semiconductive base structure 210 comprises a silicon wafer. In addition, the semiconductive base structure 210 may include one or more layers, structures, and/or regions formed therein and/or thereon. For example, the semiconductive base structure 210 may include conductively doped regions and undoped regions. The conductively doped regions may, for example, be employed as source regions and drain regions for transistors of the control logic devices 215 of the control logic region 202; and the undoped regions may, for example, be employed as channel regions for the transistors of the control logic devices 215.

As shown in FIG. 7, the gate structures 212 of the control logic region 202 of the microelectronic device 200 may vertically overlie (e.g., in the Z-direction) portions of the semiconductive base structure 210. The gate structures 212 may individually horizontally extend between and be employed by transistors of the control logic devices 215 within the control logic region 202 of the microelectronic device 200. The gate structures 212 may be formed of and include conductive material. A gate dielectric material (e.g., a dielectric oxide) may vertically intervene (e.g., in the Z-direction) between the gate structures 212 and channel regions (e.g., within the semiconductive base structure 210) of the transistors.

The first routing structures 214 may vertically overlie (e.g., in the Z-direction) the semiconductive base structure 210, and may be electrically connected to the semiconductive base structure 210 by way of the first contact structures 216. The first routing structures 214 may serve as local routing structures for the microelectronic device 200. A first group 216A of the first contact structures 216 may vertically extend between and couple regions (e.g., conductively doped regions, such as source regions and drain regions) of the semiconductive base structure 210 to one or more of the first routing structures 214. In addition, a second group 216B of the first contact structures 216 may vertically extend between and couple some of the first routing structures 214 to one another.

The first routing structures 214 may each individually be formed of and include conductive material. By way of non-limiting example, the first routing structures 214 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 214 are formed of and include Cu. In additional embodiments, the first routing structures 214 are formed of and include W.

The first contact structures 216 (including the first group 216A and the second group 216B thereof) may each individually be formed of and include conductive material. By way of non-limiting example, the first routing structures 214 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 216 are formed of and include Cu. In additional embodiments, the first contact structures 216 are formed of and include W. In further embodiments, the first contact structures 216 of the first group 216A of the first contact structures 216 are formed of and include first conductive material (e.g., W); and the first contact structures 216 of the second group 216B of the first contact structures 216 are formed of and include a second, different conductive material (e.g., Cu).

As previously mentioned, portions of the semiconductive base structure 210 (e.g., conductively doped regions serving as source regions and drain regions, undoped regions serving as channel regions), the gate structures 212, the first routing structures 214, and the first contact structures 216 form various control logic devices 215 of the control logic region 202. In some embodiments, the control logic devices 215 comprise complementary metal oxide semiconductor (CMOS) circuitry. The control logic devices 215 may be configured to control various operations of other components (e.g., memory cells within the memory array region 204) of the microelectronic device 200. As a non-limiting example, the control logic devices 215 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, string drivers, page buffers, and various chip/deck control circuitry. As another non-limiting example, the control logic devices 215 may include devices configured to control column operations for arrays (e.g., memory element array(s), access device array(s)) within the memory array region 204 of the microelectronic device 200, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the control logic devices 215 may include devices configured to control row operations for arrays (e.g., memory element array(s), access device array(s)) within the memory array region 204 of the microelectronic device 200, such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices.

Still referring to FIG. 7, the memory array region 204 of the microelectronic device 200 may include a stack structure 218; portions of the microelectronic device structure 100, including the conductive line structures 102, the insulative line structures 104, the isolation material 108, and the air gaps 110; and a source tier 237 including one or more source structure(s) 238 and one or more contact pad(s) 240. The stack structure 218 may correspond to the base structure 101, previously described with reference to FIGS. 1A and 1B, of the microelectronic device structure 100. In addition, the conductive line structures 102 may serve as digit line structures (e.g., data line structures, bit line structures) of the microelectronic device 200, and the insulative line structures 104 may serve as digit line cap structures (e.g., data line cap structures, bit line cap structures) of the microelectronic device 200. The stack structure 218 may be vertically interposed between the conductive line structures 102 and the source tier 237. The conductive line structures 102 may vertically underlie (e.g., in the Z-direction) the stack structure 218, and may be electrically connected to features (e.g., pillar structures, filled vias) within the stack structure 218. The source tier 237 may vertically overlie (e.g., in the Z-direction) the stack structure 218. The source structure(s) 238 and the contact pad(s) 240 of the source tier 237 may be coupled (e.g., electrically connected) to features (e.g., pillar structures, filled vias) within the stack structure 218 and additional features (e.g., interconnect structures) within the second interconnect region 208 of the microelectronic device 200. As shown in FIG. 7, portions of the conductive contact structures 120 of the microelectronic device structure 100 may also be located within the memory array region 204 of the microelectronic device 200. Additional portions of the conductive contact structures 120 may be located within the first interconnect region 206 of the microelectronic device 200.

The stack structure 218 of the memory array region 204 includes a vertically alternating (e.g., in the Z-direction) sequence of conductive structures 220 and insulative structures 222 arranged in tiers 224. Each of the tiers 224 of the stack structure 218 may include at least one of the conductive structures 220 vertically neighboring at least one of the insulative structures 222. In some embodiments, the conductive structures 220 are formed of and include tungsten (W) and the insulative structures 222 are formed of and include silicon dioxide ($SiO_2$). The conductive structures 220 and insulative structures 222 of the tiers 224 of the stack structure 218 may each individually be substantially planar, and may each individually exhibit a desired thickness.

As shown in FIG. 7, one or more deep contact structure(s) 226 may vertically extend through the stack structure 218. The deep contact structure(s) 226 may be configured and positioned to electrically connect one or more components of the microelectronic device 200 vertically overlying the stack structure 218 with one or more other components of the microelectronic device 200 vertically underlying the stack structure 218. The deep contact structure(s) 226 may be formed of and include conductive material. In some embodiments, the deep contact structure(s) are formed of and include W.

As shown in FIG. 7, the memory array region 204 further includes cell pillar structures 228 vertically extending through the stack structure 218. The cell pillar structures 228 may each individually include a semiconductive pillar (e.g., a polycrystalline silicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the cell pillar structures 228 and the conductive structures 220 of the tiers 224 of the stack structure 218 may define vertically extending strings of memory cells 230 coupled in series with one another within the memory array region 204 of the microelectronic device 200. In some embodiments, the memory cells 230 formed at the intersections of the conductive structures 220 and the cell pillar structures 228 within the tiers 224 of the stack structure 218 comprise so-called "MONOS" (metal-oxide-nitride-oxide-semiconductor) memory cells. In additional embodiments, the memory cells 230 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the cell pillar structures 228 and the conductive structures 220 of the different tiers 224 of the stack structure 218.

As shown in FIG. 7, the conductive line structures 102 may be vertically interposed between the stack structure 218 and the first interconnect region 206 underlying the stack structure 218. Individual conductive line structures 102 may be coupled to individual vertically extending strings of memory cells 230. In some embodiments, the conductive line structures 102 directly physically contact the cell pillar structures 228. In additional embodiments, contact structures may vertically intervene between the conductive line structures 102 and the cell pillar structures 228, and may couple the conductive line structures 102 to the vertically extending strings of memory cells 230.

With continued reference to FIG. 7, the source tier 237 may be vertically interposed between the stack structure 218 and the second interconnect region 208 overlying the stack structure 218. Within the source tier 237, the source structure(s) 238 and the contact pad(s) 240 may horizontally neighbor one another (e.g., in the X-direction, in the Y-direction). The source structure(s) 238 may be electrically isolated from the contact pad(s) 240, and may be positioned at substantially the same vertical position (e.g., in the Z-direction) as the contact pad(s) 240. At least one insulative material may be horizontally interposed between the source structure(s) 238 and the contact pad(s) 240, as described in further detail below.

The source structure(s) 238 of the source tier 237 may be coupled to the vertically extending strings of memory cells 230. In some embodiments, the source structure(s) 238 directly physically contact the cell pillar structures 228. In additional embodiments, contact structures may vertically intervene between the source structure(s) 238 and the cell pillar structures 228, and may couple the source structure(s) 238 to the vertically extending strings of memory cells 230. In addition, the source structure(s) 238 may be coupled to additional structures (e.g., contact structures, routing structures, pad structures) within the second interconnect region 208, as described in further detail below.

The contact pad(s) 240 of the source tier 237 may be coupled to the additional conductive features (e.g., conductive contact structures, conductive pillars, conductively filled vias) within the stack structure 218. For example, as shown in FIG. 7, the contact pad(s) 240 may be coupled to the deep contact structure(s) 226 vertically extending through the stack structure 218. In some embodiments, the contact pad(s) 240 directly physically contact the deep contact structure(s) 226. In additional embodiments, additional contact structures may vertically intervene between the contact pad(s) 240 and the deep contact structure(s) 226, and may couple the contact pad(s) 240 to the deep contact structure(s) 226. In addition, the contact pad(s) 240 may be coupled to additional structures (e.g., interconnect structures, routing structures, pad structures) within the second interconnect region 208, as described in further detail below.

The source structure(s) 238 and the contact pad(s) 240 may each be formed of and include conductive material. A material composition of the source structure(s) 238 may be substantially the same as a material composition of the contact pad(s) 240. In some embodiments, the source structure(s) 238 and the contact pad(s) 240 are formed of and include conductively doped semiconductive material, such as a conductively doped form of one or more of a silicon material, such as monocrystalline silicon or polycrystalline silicon; a silicon-germanium material; a germanium material; a gallium arsenide material; a gallium nitride material; and an indium phosphide material. As a non-limiting example, the source structure(s) 238 and the contact pad(s) 240 may be formed of and include epitaxial silicon (e.g., monocrystalline silicon formed through epitaxial growth) doped with at least one dopant (e.g., one or more of at least one n-type dopant, at least one p-type dopant, and at least another dopant). As another non-limiting example, the source structure(s) 238 and the contact pad(s) 240 may be formed of and include polycrystalline silicon doped with at least one dopant (e.g., one or more of at least one n-type dopant, at least one p-type dopant, and at least another dopant).

As shown in FIG. 7, optionally, strapping structures 241 may be located on or over the source structure(s) 238 and the contact pad(s) 240. The strapping structures 241 may be vertically interposed between the source structure(s) 238 and the contact pad(s) 240 and additional features (e.g., additional structures, additional materials) within the second interconnect region 208. If present, the strapping structures 241 may be formed of and include conductive material. A material composition of the strapping structures 241 may be selected to lower contact resistance (relative to configurations wherein the strapping structures 241 are absent) between conductive structures within the second interconnect region 208 and each of source structure(s) 238 and the contact pad(s) 240 of the source tier 237. By way of non-limiting example, the strapping structures 241 (if any) may be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the strapping structures 241 are formed of and include tungsten silicide ($WSi_x$). In additional embodiments, the strapping structures 241 are formed of and include one or more of (e.g., a stack of) W and tungsten nitride ($WN_x$).

With continued reference to FIG. 7, the first interconnect region 206 of the microelectronic device 200 may be vertically interposed between the control logic region 202 and the memory array region 204 of the microelectronic device 200. The first interconnect region 206 may couple features of the control logic region 202 with features of the memory array region 204. As shown in FIG. 7, the first interconnect region 206 may include second contact structures 242 coupled to the first routing structures 214 of the control logic region 202; portions of the conductive contact structures 120 of the microelectronic device structure 100 coupled to the conductive line structures 102 of the memory array region 204; and connected bond pads 246 extending between and coupling the second contact structures 242 and the conductive contact structures 120. The connected bond pads 246 may include first bond pads 248 on (e.g., vertically overlying and directly adjacent) the second contact structures 242, and the conductive pad structures 124 (serving as second bond pads) of the microelectronic device structure 100. The first bond pads 248 and the conductive pad structures 124 may be physically connected to one another to form the connected bond pads 246.

The second contact structures 242 of the first interconnect region 206 may vertically extend from and between the first bond pads 248 and some of the first routing structures 214 of the control logic region 202. In some embodiments, the second contact structures 242 comprise conductively filled vias vertically extending through dielectric material interposed between the first bond pads 248 and the first routing structures 214. The second contact structures 242 may be formed of and include conductive material. By way of non-limiting example, the second contact structures 242 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the second contact structures 242 is formed of and includes Cu.

The connected bond pads 246 of the first interconnect region 206 may vertically extend from and between the second contact structures 242 and the conductive contact structures 120 of the microelectronic device structure 100. The first bond pads 248 of the connected bond pads 246 may vertically extend from and between the second contact structures 142 and the conductive pad structures 124 of the connected bond pads 246; and the conductive pad structures 124 of the connected bond pads 246 may vertically extend from and between the conductive contact structures 120 and the first bond pads 248 of the connected bond pads 246. While in FIG. 1, the first bond pad 248 and the conductive pad structure 124 of each connected bond pad 246 are distinguished from one another by way of a dashed line, the first bond pad 248 and the conductive pad structure 124 may be integral and continuous with one another. Put another way, each connected bond pad 246 may be a substantially monolithic structure including the first bond pad 248 as a first region thereof, and the conductive pad structure 124 as a second region thereof. For each connected bond pad 246, the first bond pad 248 thereof may be attached to the conductive pad structure 124 thereof without a bond line.

The connected bond pads 246 (including the first bond pads 248 and the conductive pad structures 124 thereof) may be formed of and include conductive material. By way of non-limiting example, the connected bond pads 246 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the connected bond pads 246 (including the first bond pads 248 and the conductive pad structures 124 thereof) is formed of and includes Cu.

Still referring to FIG. 7, at least one insulative material 232 may cover and surround the second contact structures 242 and the first bond pads 248 of the connected bond pads 246. The insulative material 232 may be attached to the additional isolation material 122 of the microelectronic device structure 100. A material composition of the insulative material 232 may be substantially the same as a material composition of the additional isolation material 122, or the material composition of the insulative material 232 may be different than the material composition of the additional isolation material 122. In some embodiments, the insulative material 232 is formed of and includes at least one dielectric oxide material, such as $SiO_x$ (e.g., $SiO_2$). In additional embodiments, the insulative material 232 is formed of and includes at least one low-k dielectric material, such as one or more of $SiO_xC_y$, $SiO_xN_y$, $SiC_xO_yH_z$, and $SiO_xC_zN_y$. The insulative material 232 may be substantially homogeneous, or the insulative material 232 may be heterogeneous. In some embodiments, the insulative material 232 is substantially homogeneous. In additional embodiments, the insulative material 232 is heterogeneous. The insulative material 232 may, for example, be formed of and include a stack of at least two different dielectric materials.

With continued reference to FIG. 7, the second interconnect region 208 of the microelectronic device 200 may vertically overlie the memory array region 204 of the microelectronic device 200. The second interconnect region 208 may include second routing structures 252 and conductive pads 256. The second routing structures 252 may vertically overlie the source tier 237 (including the source structure(s) 238 and the contact pad(s) 240 thereof) of the memory array region 204, and may be coupled to the source structure(s) 238 and the contact pad(s) 240 by way of third contact structures 254. The third contact structures 254 may extend between the second routing structures 252 and the source structure(s) 238 and the contact pad(s) 240 of the source tier 237. If present, the strapping structures 241 may vertically intervene between the third contact structures 254 and the source structure(s) 238 and the contact pad(s) 240. The conductive pads 256 may vertically overlie the second routing structures 252, and may be coupled to the second routing structures 252 by way of fourth contact structures 258. The fourth contact structures 258 may extend from and between the second routing structures 252 and the conductive pads 256.

The second routing structures 252 and the conductive pads 256 may serve as global routing structures for the microelectronic device 200. The second routing structures 252 and the conductive pads 256 may, for example, be configured to receive global signals from an external bus, and to relay the global signals to other components (e.g., structures, devices) of the microelectronic device 200.

The second routing structures 252, the third contact structures 254, the conductive pads 256, and the fourth contact structures 258 may each be formed of and include conductive material. By way of non-limiting example, the second routing structures 252, the third contact structures 254, the conductive pads 256, and the fourth contact structures 258 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second routing structures 252 and the third contact structures 254 are each formed of and include Cu, the conductive pads 256 are formed of and include Al, and the fourth contact structures 258 are formed of and include W. In additional embodiments, the second routing structures 252 are formed of and include Cu, the conductive pads 256 are formed of and include Al, and the third contact structures 254 and the fourth contact structures 258 are each formed of and include W.

Still referring to FIG. 7, at least one additional insulative material 260 may cover and surround the second routing structures 252, the third contact structures 254, the conductive pads 256, and the fourth contact structures 258. The at least one additional insulative material 260 may also cover and surround portions of the source structure(s) 238 and the contact pad(s) 240. A material composition of the additional insulative material 260 may be substantially the same as or may be different than a material composition of the insulative material 132. In some embodiments, the additional insulative material 260 is formed of and includes at least one dielectric oxide material, such as $SiO_x$ (e.g., $SiO_2$). In additional embodiments, the additional insulative material 260 is formed of and includes at least one low-k dielectric material, such as one or more of $SiO_xC_y$, $SiO_xN_y$, $SiC_xO_yH_z$, and $SiO_xC_zN_y$. The additional insulative material 260 may be substantially homogeneous, or the additional insulative material 260 may be heterogeneous. If the additional insulative material 260 is heterogeneous, amounts of one or more elements included in the additional insulative material 260 may vary stepwise (e.g., change abruptly), or may vary continuously (e.g., change progressively, such as linearly, parabolically) throughout different portions of the additional insulative material 260. In some embodiments, the additional insulative material 260 is substantially homogeneous. In additional embodiments, the additional insulative material 260 is heterogeneous. The additional insulative material 260, for example, be formed of and include a stack of at least two different dielectric materials.

Thus, a microelectronic device in accordance to embodiments of the disclosure comprises conductive line structures, insulative line structures, partially filled trenches, conductive contact structures, and conductive pad structures. The conductive line structures extending in a first horizontal direction. The insulative line structures are on the conductive line structures and extend in the first horizontal direction. The partially filled trenches intervene between the conductive line structures in a second horizontal direction orthogonal to the first horizontal direction. The partially filled trenches comprise an isolation material on side surfaces of the conductive line structures and the insulative line structures, and air gaps surrounded by the isolation material. The conductive contact structures vertically extend through portions of the insulative line structures and contact the conductive line structures. The conductive pad structures are on the conductive contact structures.

Furthermore, a memory device in accordance with embodiments of the disclosure comprises a memory array region, a control logic region vertically underlying the memory array region, and an interconnect region vertically interposed between the memory array region and the control logic region. The memory array region comprises a stack structure comprising vertically alternating conductive structures and insulating structures; vertically extending strings of memory cells within the stack structure; a source structure vertically overlying the stack structure and coupled to the vertically extending strings of memory cells; digit line structures vertically underlying the stack structure and coupled to the vertically extending strings of memory cells; dielectric cap structures vertically underlying the digit line structures; an isolation material horizontally interposed between the digit line structures and horizontally interposed between the dielectric cap structures; and air gaps surrounded by the isolation material and horizontally alternating with the digit line structures. The control logic region comprises control logic devices configured to effectuate a portion of control operations for the vertically extending strings of memory cells. The interconnect region comprises structures coupling the digit line structures of the memory array region to the control logic devices of the control logic region.

FIGS. 8A through 8D are simplified, partial cross-sectional views illustrating embodiments of a method of forming the microelectronic device 200 described above with reference to FIG. 7. With the description provided below, it will be readily apparent to one of ordinary skill in the art that the methods and structures described herein may be used to form various devices and electronic systems.

Figure 8A:
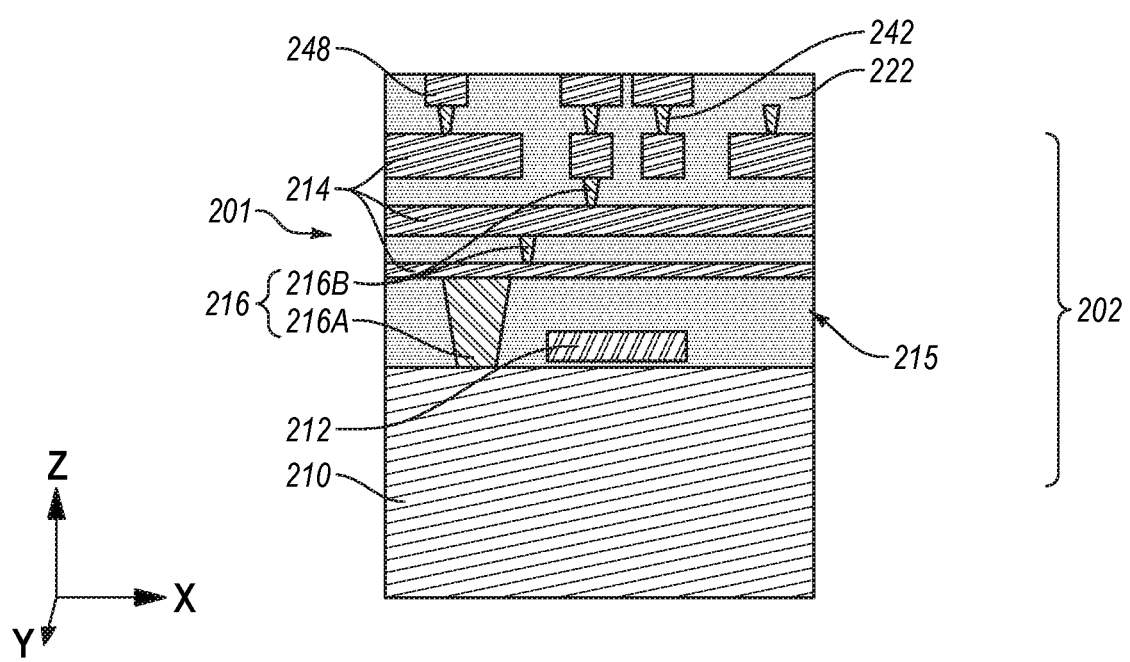
FIGS. 8A through 8D are simplified, partial cross-sectional views illustrating a method of forming the microelectronic device shown in FIG. 7, in accordance with embodiments of the disclosure.

Referring to FIG. 8A, a first microelectronic device construction 201 may be formed to include the control logic region 202 of the microelectronic device 200 (FIG. 7), including the semiconductive base structure 210, the gate structures 212, the first routing structures 214, and the first contact structures 216 thereof. The first microelectronic device construction 201 may also be formed to include the second contact structures 242, the first bond pads 248, and the insulative material 232. The first microelectronic device construction 201 may be formed using conventional processes (e.g., conventional material deposition processes, conventional material removal processes) and conventional processing equipment, which are not described in detail herein.

Figure 8B:
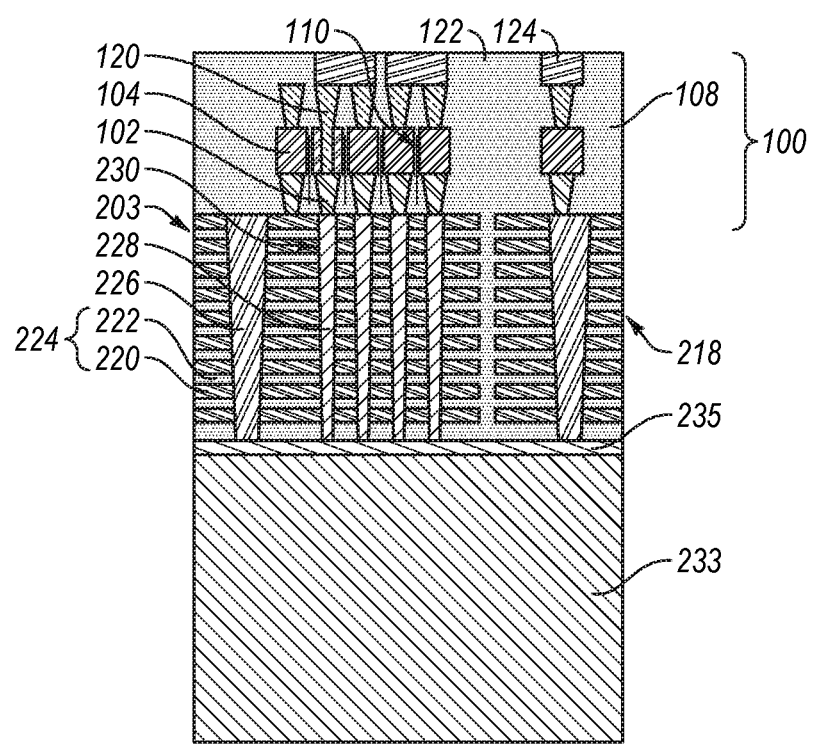

Referring next to FIG. 8B, a second microelectronic device construction 203 may be formed to include a carrier structure 233 (e.g., a carrier wafer); a doped semiconductive material 235 (e.g., conductively doped silicon, such as one or more conductively doped monocrystalline silicon and conductively doped polycrystalline silicon) on or over the carrier structure 233; the stack structure 218; the deep contact structure(s) 226; the cell pillar structures 228; and the microelectronic device structure 100, including the conductive line structures 102, the insulative line structures 104, the isolation material 108, the air gaps 110, the conductive contact structures 120, the additional isolation material 122, and the conductive pad structures 124 thereof. The second microelectronic device construction 203 may be formed separate from the first microelectronic device construction 201 (FIG. 8A).

The carrier structure 233 of the second microelectronic device construction 203 comprises a base material or construction upon which additional features (e.g., materials, structures, devices) of the second microelectronic device construction 203 are formed. The carrier structure 233 may, for example, be formed of and include one or more of semiconductive material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductive material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; α-$Al_2O_3$), and silicon carbide). The carrier structure 233 may be configured to facilitate safe handling of the second microelectronic device construction 203 for subsequent attachment to the first microelectronic device construction 201, as described in further detail below.

In some embodiments, the doped semiconductive material 235 is formed on or over the carrier structure 233, and then the stack structure 218 (including the tiers 224 of the conductive structures 220 and the insulative structures 222 there) is formed on or over the doped semiconductive material 235. The deep contact structure(s) 226, the cell pillar structures 228, and additional features (e.g., filled trenches, contact regions, additional contact structures) may then be formed within the stack structure 218. Thereafter, the microelectronic device structure 100 (including the conductive line structures 102, the insulative line structures 104, the isolation material 108, the air gaps 110, the conductive contact structures 120, the additional isolation material 122, and the conductive pad structures 124 thereof) may be formed on or over the stack structure 218 through the process previously described herein with reference to FIGS. 1A through 6B (wherein the stack structure 218 corresponds to the base structure 101 in FIGS. 1A through 6B).

Figure 8C:
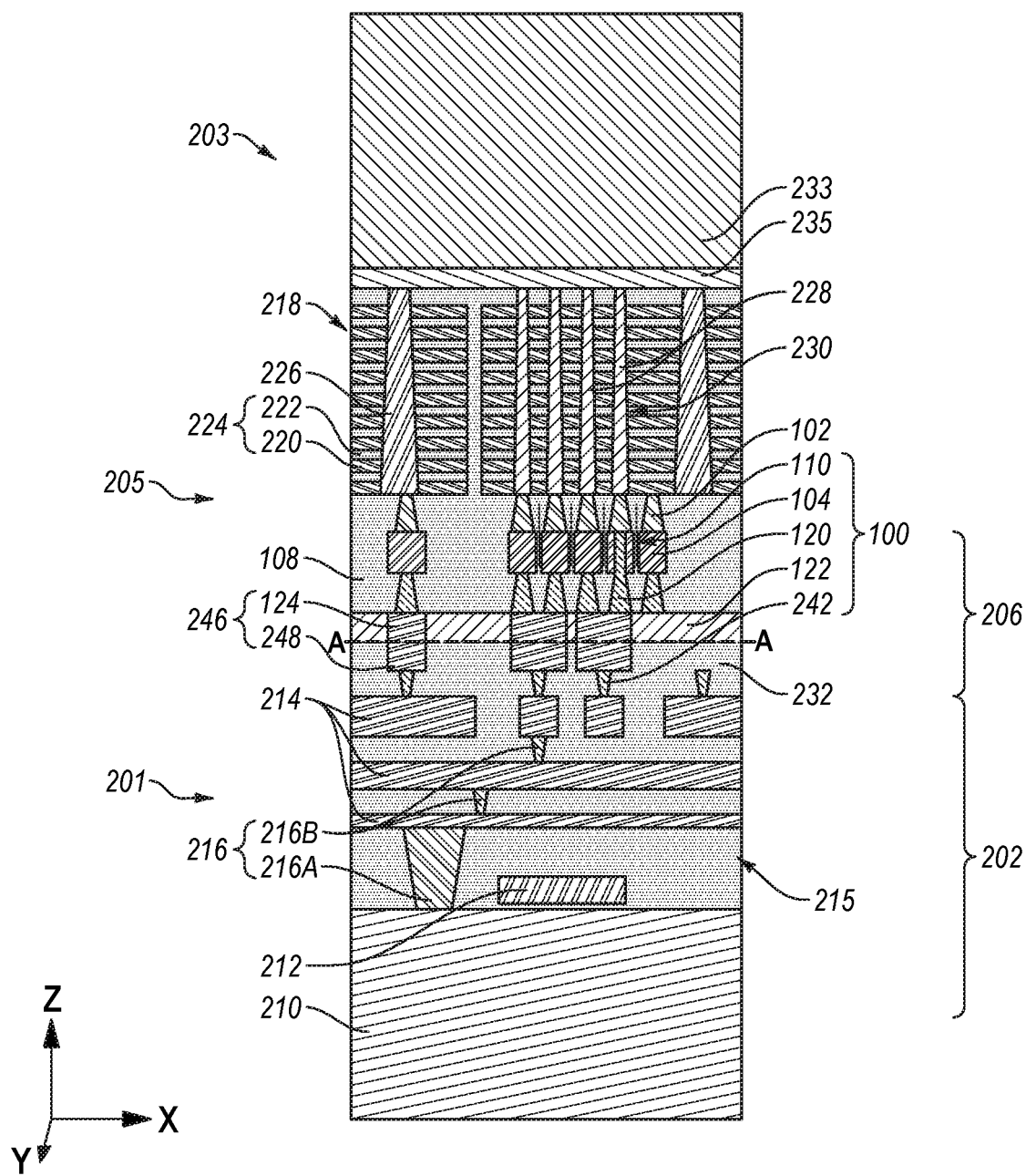

Referring to next to FIG. 8C, following the formation of the first microelectronic device construction 201 and the separate formation of the second microelectronic device construction 203, the second microelectronic device construction 203 may be vertically inverted (e.g., flipped upside down in the Z-direction) and attached (e.g., bonded) to the first microelectronic device construction 201 to form a microelectronic device structure assembly 205. Alternatively, the first microelectronic device construction 201 may be vertically inverted (e.g., flipped upside down in the Z-direction) and attached to the second microelectronic device construction 203 to form the microelectronic device structure assembly 205. The attachment of the second microelectronic device construction 203 to the first microelectronic device construction 201 may attach the conductive pad structures 124 of the second microelectronic device construction 203 to the first bond pads 248 of the first microelectronic device construction 201 to form the connected bond pads 246. In addition, the attachment of the second microelectronic device construction 203 to the first microelectronic device construction 201 may also attach the additional isolation material 122 of the second microelectronic device construction 203 to the insulative material 232 of the first microelectronic device construction 201. In FIG. 8C, vertical boundaries of the first microelectronic device construction 201 relative to the second microelectronic device construction 203 prior to the attachment of the first microelectronic device construction 201 to the second microelectronic device construction 203 to form the microelectronic device structure assembly 205 are depicted by the dashed line A-A. The first microelectronic device construction 201 may be attached to the second microelectronic device construction 203 without a bond line.

Figure 8D:
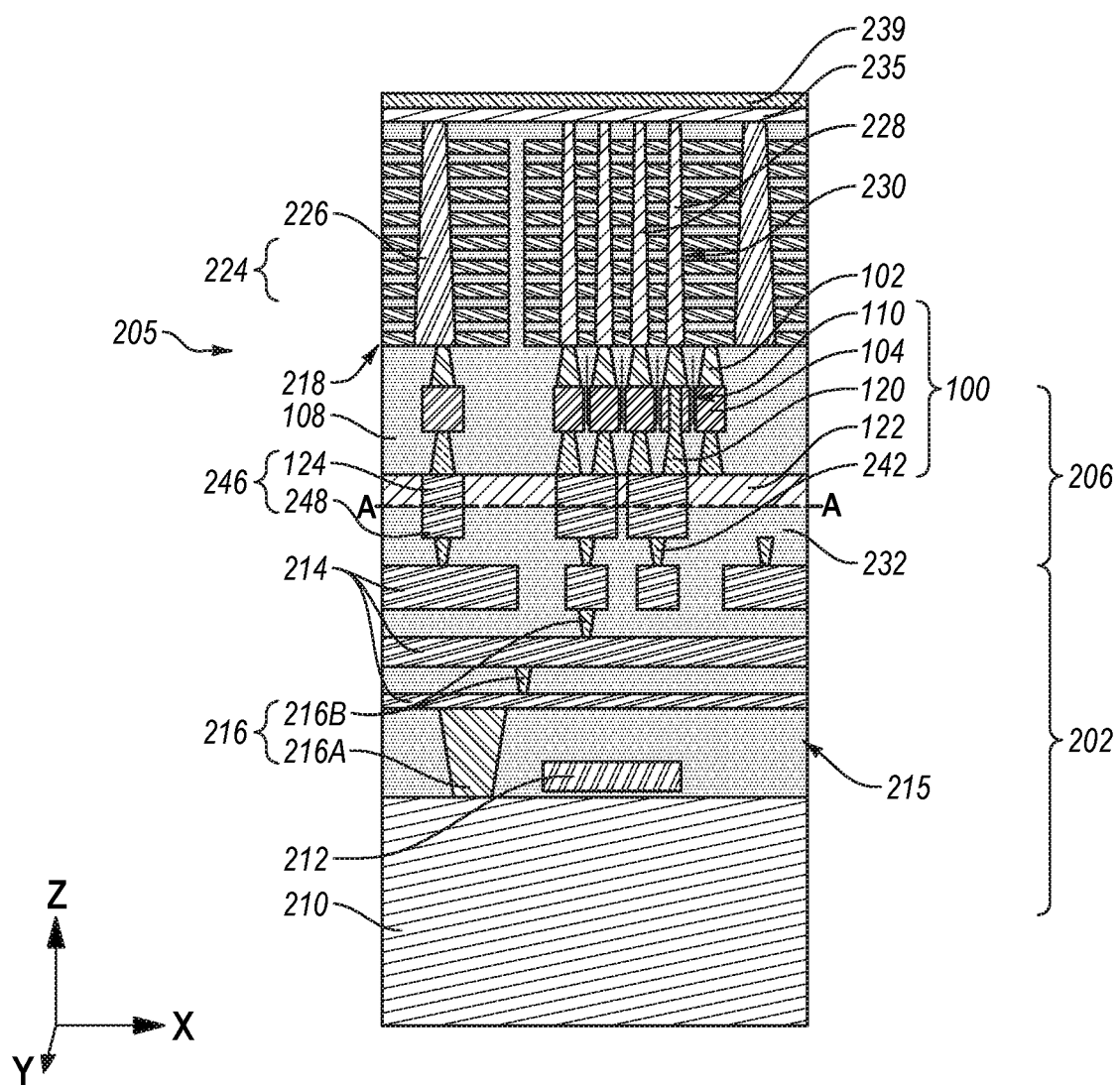

Referring next to FIG. 8D, after attaching the second microelectronic device construction 203 (FIG. 8C) to the first microelectronic device construction 201 (FIG. 8C), the carrier structure 233 (FIG. 8C) may be removed (e.g., through conventional detachment processes and/or conventional grinding processes) from the microelectronic device structure assembly 205 to expose (e.g., uncover) the doped semiconductive material 235. Optionally, an additional amount (e.g., additional volume) of doped semiconductive material (e.g., doped polycrystalline silicon) may be formed on doped semiconductive material 235 following the removal of the carrier structure 233 (FIG. 2A). If formed, the additional amount of doped semiconductive material may have substantially the same material composition as that of the doped semiconductive material 235, or may have a different material composition than that of the doped semiconductive material 235. In addition, optionally, a strapping material 239 may formed on or over the doped semiconductive material 235. The strapping material 239 (if any) may comprise one or more of the conductive materials previously described in relation to the strapping structures 241 (FIG. 7). The doped semiconductive material 235 (and the additional amount of doped semiconductive material, if any) may, optionally, be annealed (e.g., thermally annealed) before and/or after the formation of the strapping material 239 (if any). Annealing the doped semiconductive material 235 may, for example, facilitate or enhance dopant activation within the doped semiconductive material 235.

Referring collectively to FIGS. 7 and 8D, following the removal of the carrier structure 233 (FIG. 8C), portions of the doped semiconductive material 235 (and the additional amount of doped semiconductive material, if any) and the strapping material 239 (FIG. 8D) (if any) may be removed (e.g., etched) to respectively form the source structure(s) 238 (FIG. 7), the contact pad(s) 240 (FIG. 7), and the strapping structures 241 (FIG. 7) (if any). Thereafter, the third contact structures 254 (FIG. 7) may be formed on or over the source structure(s) 238 and the contact pad(s) 240, and the second routing structures 252 (FIG. 7) may then be formed on or over the third contact structures 254. The fourth contact structures 258 (FIG. 7) may then be formed on or over the second routing structures 252, and the conductive pads 256 (FIG. 7) may be formed on or over the fourth contact structures 258 to effectuate the formation of the microelectronic device 200 (FIG. 7).

Thus, in accordance with embodiments of the disclosure, a method of forming a memory device comprises forming a first microelectronic device construction comprising control logic devices. A second microelectronic device construction is formed to comprise a carrier structure; a stack structure overlying the carrier structure and comprising vertically alternating conductive structures and insulating structures; vertically extending strings of memory cells within the stack structure; digit line structures vertically overlying the stack structure; dielectric cap structures vertically overlying the digit line structures; a dielectric material horizontally intervening between the digit line structures and horizontally intervening between the dielectric cap structures; and air gaps surrounded by the dielectric material and horizontally intervening between the digit line structures. The second microelectronic device construction is attached to the first microelectronic device construction to form a microelectronic device structure assembly, the digit line structures vertically interposed between the stack structure and the control logic devices within the microelectronic device structure assembly. The carrier structure is removed from the microelectronic device structure assembly. At least one source structure is formed over the stack structure of the microelectronic device structure assembly.

Microelectronic device structures (e.g., the microelectronic device structure 100 (FIGS. 6A and 6B)) and microelectronic devices (e.g., the microelectronic device 200 (FIG. 7)) in accordance with embodiments of the disclosure may be used in embodiments of electronic systems of the disclosure. For example, FIG. 9 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, one or more of a microelectronic device structure (e.g., the microelectronic device structure 100 (FIGS. 6A and 6B)) and a microelectronic device (e.g., the microelectronic device 200 (FIG. 7)) previously described herein. The electronic system 300 may further include at least one electronic signal processor device 304 (often referred to as a "microprocessor"). The electronic signal processor device 304 may, optionally, include one or more of a microelectronic device structure (e.g., the microelectronic device structure 100 (FIGS. 6A and 6B)) and a microelectronic device (e.g., the microelectronic device 200 (FIG. 7)) previously described herein. While the memory device 302 and the electronic signal processor device 304 are depicted as two (2) separate devices in FIG. 7, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100 (FIGS. 6A and 6B)) and a microelectronic device (e.g., the microelectronic device 200 (FIG. 7)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system according to embodiments of the disclosure comprises an input device, an output device, a processor device operably coupled to the input device and the output device, and a memory device operably coupled to the processor device. The memory device comprises a stack structure, a source structure, digit lines, strings of memory cells, dielectric nitride structures, insulative material, air gaps within the insulative material, conductive contacts, conductive pads, and control logic circuitry. The stack structure comprises tiers each comprising a conductive structure and an insulative structure vertically neighboring the conductive structure. The source structure overlies the stack structure. The digit lines underlie the stack structure. The strings of memory cells extend through stack structure and are coupled to the source structure and the digit lines. The dielectric nitride structures underlie the digit lines. The insulative material is interposed between the digit lines and is interposed between the dielectric nitride structures. The air gaps within the insulative material are interposed between the digit lines. The conductive contacts extend through the dielectric nitride structures and are coupled to the digit lines. The conductive pads underlie and are coupled to the conductive contacts. The control logic circuitry underlies and is coupled to the conductive pads.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
    conductive bit lines extending in a first horizontal direction;
    insulative line structures vertically adjacent the conductive bit lines and extending in the first horizontal direction;
    partially filled trenches intervening between the conductive bit lines in a second horizontal direction orthogonal to the first horizontal direction, the partially filled trenches comprising:
    an isolation material on side surfaces of the conductive bit lines and the insulative line structures; and
    air gaps surrounded by the isolation material and vertically overlapping the conductive bit lines;
    conductive contact structures vertically extending through portions of the insulative line structures and directly physically contacting the conductive bit lines, the conductive contact structures partially vertically overlapping the air gaps; and
    conductive pad structures vertically adjacent the conductive contact structures;
    wherein vertically lower portions of the conductive contact structures are relatively horizontally narrower than vertically upper portions of the conductive contact structures; and
    further comprising dielectric spacer structures physically contacting side surfaces of the vertically upper portions of the conductive contact structures, but not physically contacting side surfaces of the vertically lower portions of the conductive contact structures.

2. The microelectronic device of claim 1, wherein the isolation material horizontally extends over upper surfaces of the insulative line structures.

3. The microelectronic device of claim 1, wherein the conductive pad structures comprise copper.

4. A memory device, comprising:
a memory array region comprising:
a stack structure comprising multiple tiers vertically adjacent one another, each tier of the multiple tiers comprising a conductive structure and an insulating structure vertically adjacent the conductive structure;
strings of memory cells each vertically extending through the multiple tiers of the stack structure;
a source structure vertically overlying the stack structure and coupled to the strings of memory cells;
conductive digit lines vertically underlying the stack structure and coupled to the strings of memory cells;
dielectric cap structures directly vertically underlying the conductive digit lines;
an isolation material horizontally interposed between the conductive digit lines and horizontally interposed between the dielectric cap structures;
air gaps surrounded by the isolation material, the air gaps vertically overlapping and horizontally alternating with the conductive digit lines;
a control logic region vertically underlying the memory array region and comprising control logic devices configured to effectuate a portion of control operations for the strings of memory cells; and
an interconnect region vertically interposed between the memory array region and the control logic region and comprising structures coupling the conductive digit lines of the memory array region to the control logic devices of the control logic region, the structures comprising conductive contact structures vertically extending through the dielectric cap structures of the memory array region and directly physically contacting the conductive digit lines, the conductive contact structures partially vertically overlapping the air gaps;
wherein the structures of the interconnect region further comprise:
additional conductive contact structures physically contacting conductive routing structures within the control logic region; and
conductive pad structures vertically extending from and between the conductive contact structures and the additional conductive contact structures.

5. The memory device of claim 4, wherein conductive contact structures comprise:
first portions relatively vertically closer to the conductive digit lines; and
second portions relatively vertically closer to the conductive pad structures, the second portions of the conductive contact structures relatively horizontally wider than the first portions of the conductive contact structures.

6. The memory device of claim 5, further comprising dielectric spacer structures horizontally interposed between the second portions of the conductive contact structures and each of the isolation material and the dielectric cap structures.

* * * * *

UNITED STATES PATENT AND TRADEMARK OFFICE
CERTIFICATE OF CORRECTION

PATENT NO. : 11,705,367 B2
APPLICATION NO. : 16/905452
DATED : July 18, 2023
INVENTOR(S) : Kunal R. Parekh It is certified that error appears in the above-identified patent and that said Letters Patent is hereby corrected as shown below:

In the Specification

| | | |
|---|---|---|
| Column 2, | Line 32, | change "cell ON/OFT speed," to --cell ON/OFF speed,-- |
| Column 3, | Line 65, | change "(e.g, closest to)" to --(e.g., closest to)-- |
| Column 8, | Line 60, | change "(e.g., Sift)." to --(e.g., $SiO_2$).-- |

Signed and Sealed this
Thirty-first Day of October, 2023

Katherine Kelly Vidal
*Director of the United States Patent and Trademark Office*